(12) United States Patent
Pallaro et al.

(10) Patent No.: US 7,518,099 B2
(45) Date of Patent: Apr. 14, 2009

(54) MULTIFUNCTIONAL OPTICAL SENSOR COMPRISING A PHOTODETECTORS MATRIX COUPLED TO A MICROLENSES MATRIX

(75) Inventors: Nereo Pallaro, Orbassano (IT); Davide Capello, Orbassano (IT); Piermario Repetto, Orbassano (IT); Roberto Finizio, Orbassano (IT); Cosimo Carvignese, Orbassano (IT); Luca Liotti, Orbassano (IT)

(73) Assignee: C.R.F. Societa Consortile Per Azioni, Orbassano (Turin) (IT)

( * ) Notice: Subject to any disclaimer, the term of this patent is extended or adjusted under 35 U.S.C. 154(b) by 39 days.

(21) Appl. No.: 11/533,089

(22) Filed: Sep. 19, 2006

(65) Prior Publication Data

US 2007/0096010 A1    May 3, 2007

(30) Foreign Application Priority Data

Sep. 19, 2005   (EP)  .................. 05425654

(51) Int. Cl.
*G06M 7/00*    (2006.01)
*H01J 3/14*    (2006.01)

(52) U.S. Cl. .................... 250/221; 250/216
(58) Field of Classification Search .......... 250/208.1, 250/216, 239, 221
See application file for complete search history.

(56) References Cited

U.S. PATENT DOCUMENTS 5,760,962 A    6/1998    Schofield et al.

2001/0026322 A1    10/2001    Takahashi et al.
2005/0088753 A1    4/2005    Shimizu et al.

FOREIGN PATENT DOCUMENTS

| EP | 1 418 089 | 5/2004 |
|----|-----------|--------|
| EP | 1 521 226 | 4/2005 |
| WO | WO 00/53466 | 9/2000 |

OTHER PUBLICATIONS

European Search Report for Application No. EP 05425654, Dated Mar. 31, 2006.

*Primary Examiner*—Que T Le
*Assistant Examiner*—Pascal M Bui-Pho
(74) *Attorney, Agent, or Firm*—Patterson & Sheridan, L.L.P.

(57) ABSTRACT

Multifunctional optical sensor, comprising a matrix of photodetectors of the CCD or CMOS type, having a sensitive area divided into sub-areas, each of which, individually or combined with others, is dedicated to a specific function of monitoring the scene or measuring environmental parameters. The optical sensor comprises a matrix of microlenses, each of which is set to focus the radiation coming from a portion of solid angle on the associated photodetector or cluster of mutually contiguous photodetectors. Each function is associated to a single microlens or to a single subgroup of mutually contiguous microlenses or to multiple, not mutually contiguous microlenses or to multiple, not mutually contiguous subgroups of microlenses. The angular separation between the central directions of the portions of solid angle subtended by adjacent photodetectors or adjacent clusters of photodetectors is not constant within the matrix.

23 Claims, 24 Drawing Sheets

$\alpha 1 \ne \alpha 2 \ne \alpha 3$ $\alpha 1 \neq \alpha 2 \neq \alpha 3$

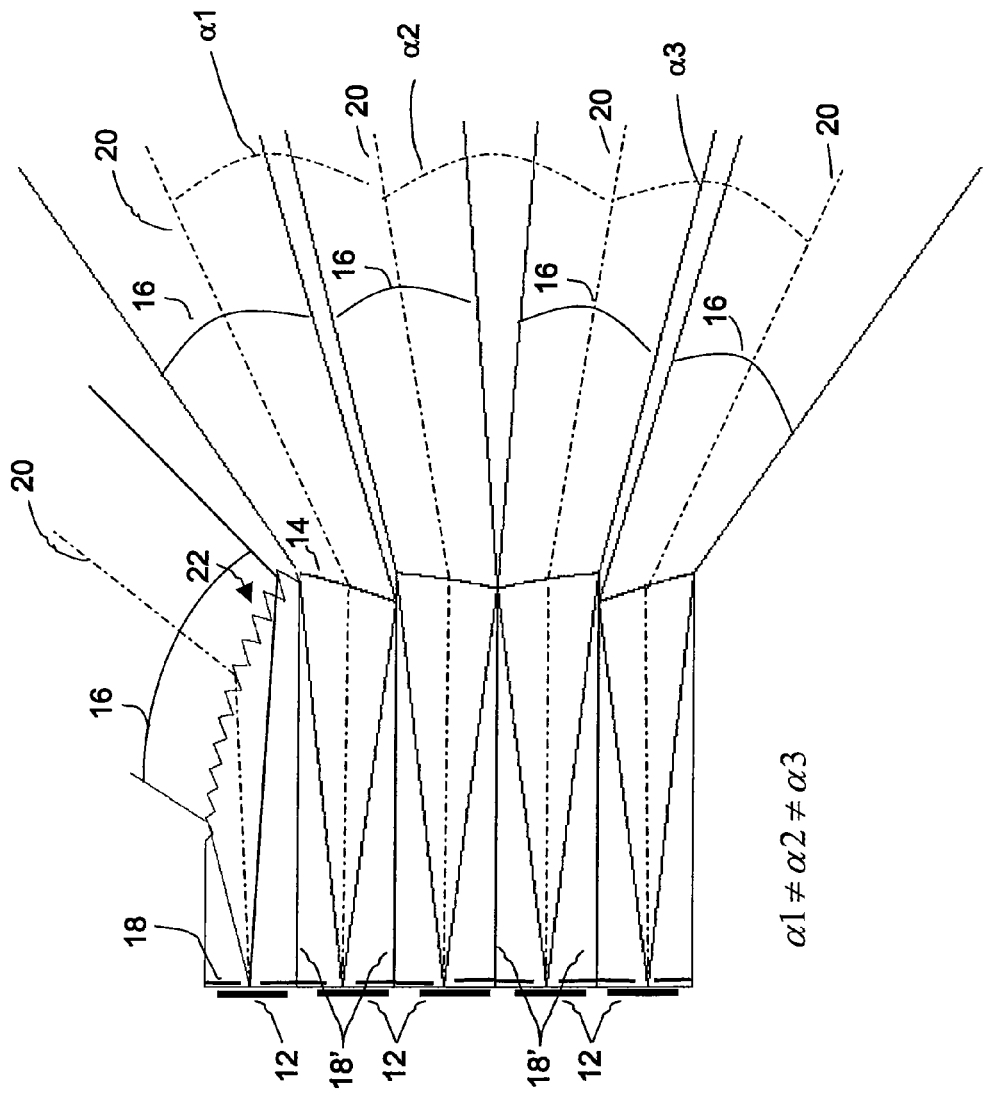

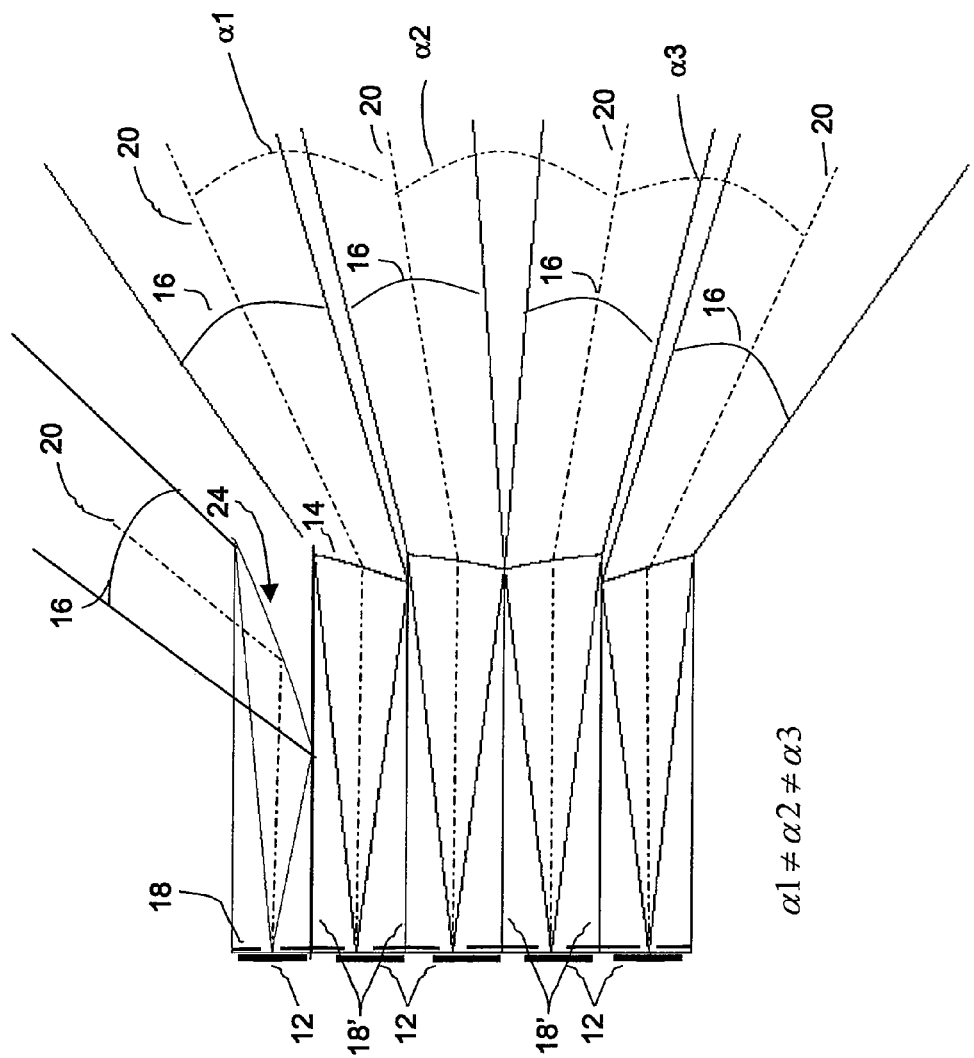

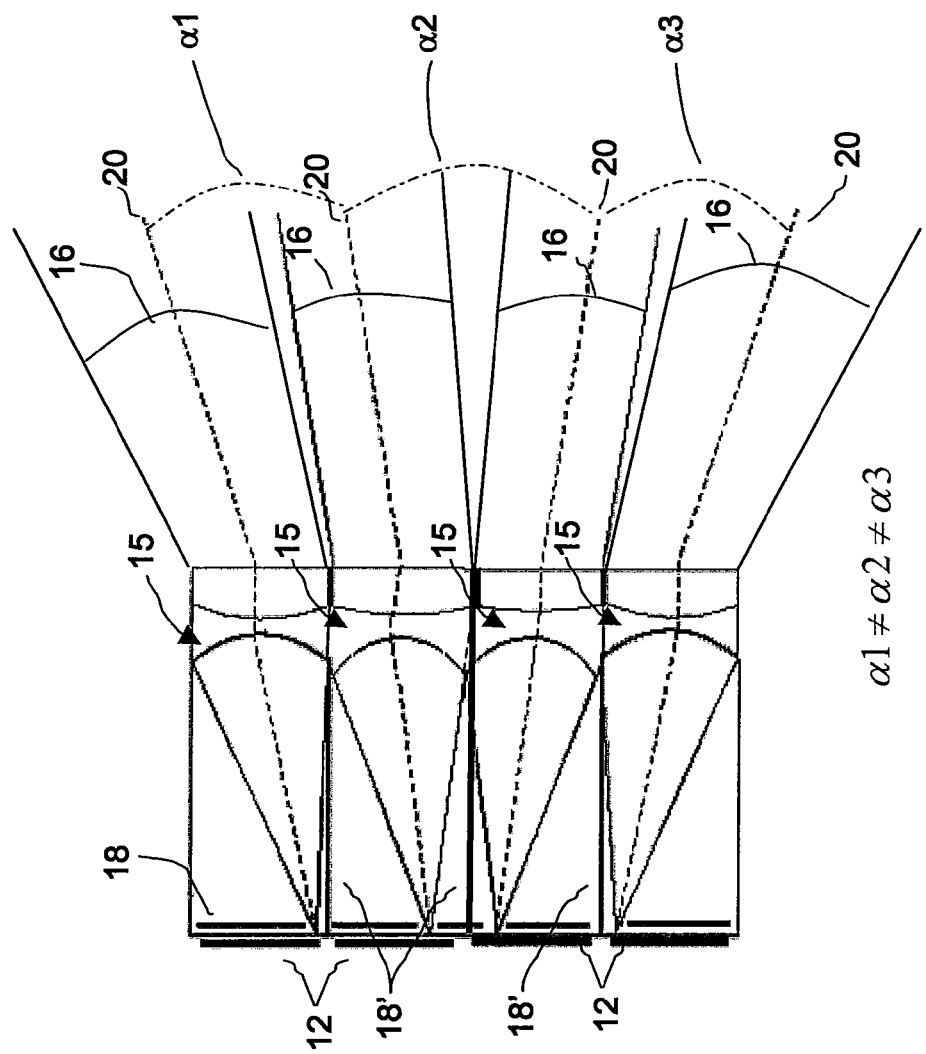

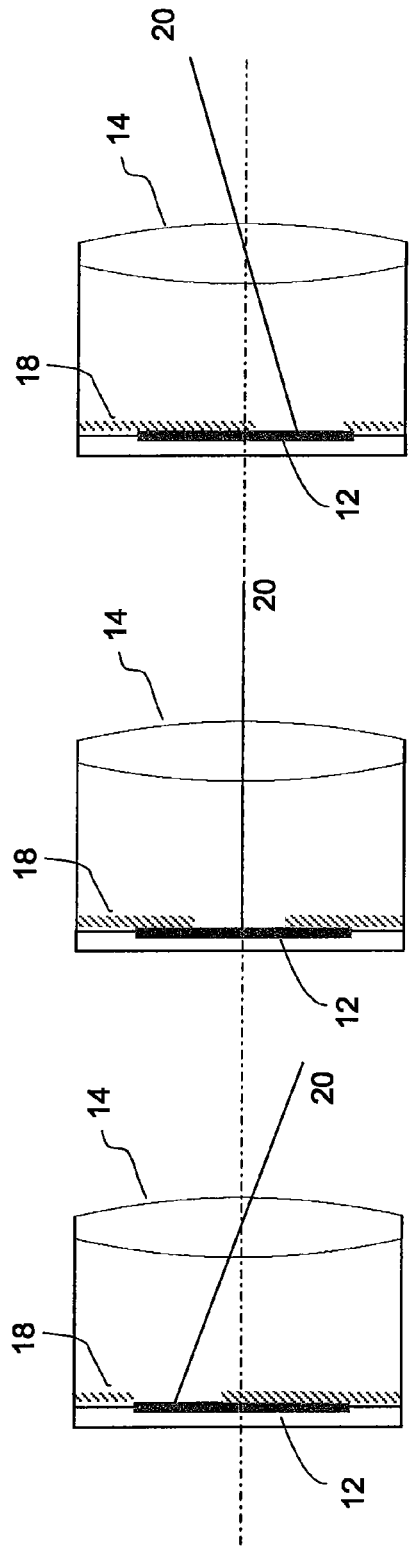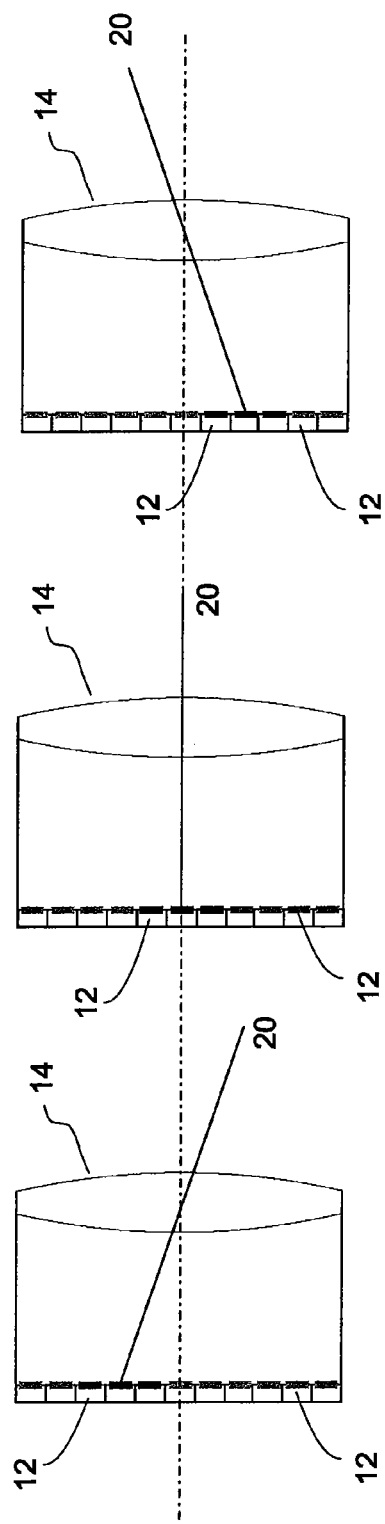

MULTIFUNCTIONAL OPTICAL SENSOR COMPRISING A PHOTODETECTORS MATRIX COUPLED TO A MICROLENSES MATRIX

CROSS-REFERENCE TO RELATED APPLICATIONS

This application claims benefit of European patent application serial number 05425654.0, filed Sep. 19, 2005, which is herein incorporated by reference.

BACKGROUND OF THE INVENTION

1. Field of the Invention

The present invention relates to a multifunctional optical sensor, in particular for automotive use, comprising a matrix of photodetectors of the CCD or CMOS type having a sensitive area divided into sub-areas, which, individually or combined together, are designated to specific functions of monitoring the scene or measuring environmental parameters.

The scene monitoring functions include monitoring the scene in front, behind or laterally to the vehicle. The frontal monitoring detects, for example, the presence of a vehicle coming from the opposite direction, the presence of a curve or the movement of the vehicle towards the longitudinal demarcation lines of the lane. The monitoring behind the vehicle can, for example, aid parking maneuvers. The lateral monitoring detects, for example, the vehicles that arrive laterally and that are not visible with the external rear-view mirror, since they are in the so-called "blind angle".

The measurement of environmental parameters comprises, for example, the measurement of fog, rain, window fogging, illumination and solar irradiation conditions.

2. Description of the Related Art

The documents EP-A-1 418 089 and EP-A-1 521 226 by the same Applicant describe multifunctional optical sensors, but refer to multifunctional integration solutions on matrix of photodetectors of the CCD or CMOS type by means of single aperture optics or matrices of lenses positioned in front of the optical window of the sensor. In the document EP-A-1 521 226, each function is associated to a single lens (or to multiple lenses positioned on different matrices) and said lens is associated to a subgroup of photodetectors.

FIG. 1 shows a perspective view of an embodiment of the sensor according to the invention of the document EP-A-1 418 089. Use of single aperture optics limits the possibility of reducing the size of the opto-mechanical system as a whole. Moreover, the complexity of the process for the construction and assembly of the system does not allow significantly to lower the costs of the sensor for large volumes.

SUMMARY OF THE INVENTION

The object of the present invention is to provide an optical sensor of the type defined above which enables to:
  optimise the partition of the matrix: there is more freedom in defining the shape (rectangular, trapezoidal, linear) and the co-ordinates of the sub-areas of the photodetectors matrix associated to each function, the photodetectors used solely for the separation of the sub-areas are reduced or eliminated, the entire sensitive area is used and it is possible to assign different directions and fields of view to photodetectors belonging to the same sub-area/function (as will be illustrated farther on);
  miniaturise the sensor from the optics and chip viewpoint: using microlenses matrices, the typical dimensions of single aperture optical systems are eliminated, by optimising the partition of the matrix its format is reduced; high miniaturisation simplifies integration on the vehicle, enabling to insert the optical sensor in the rear-view mirrors, near the roof, in the ceiling lamp, etc.;
  simplify image processing: every photodetector or group of photodetectors has its field of view and direction optimised in such a way as to achieve a sort of optical "pre-processing";
  reduce costs thanks to optimised formats of the matrix, low cost microlens fabrication processes, deposition of interference filters on the surfaces of the microlens matrices adjacent to the photodetectors.

According to the present invention, said object is achieved by a multifunctional optical sensor having the characteristics set out in claim 1.

BRIEF DESCRIPTION OF THE DRAWINGS

The present invention shall now be described in detail with reference to the accompanying drawings, provided purely by way of non limiting example, in which:

FIGS. 7 and 8 are schematic views illustrating the principle of operation of two variants of the optical system of FIG. 6;

FIG. 9 is a schematic view showing the principle of operation of the optical system of the present invention according to a third embodiment;

FIG. 10 shows the principle of operation of a microlens matrix with high resolution, not operating with the aid of diaphragms;

DETAILED DESCRIPTION

The present invention relates to a multifunctional optical sensor comprising a matrix of photodetectors of the CCD or CMOS type and a matrix of microlenses, in which each microlens is coupled to a subgroup (cluster) of photodetectors (pixels) or to a single photodetector. The microlenses are grouped in subgroups, each of which, individually or combined with others, is dedicated to a specific function of monitoring the scene or measuring environmental parameters.

The present invention is directed, in particular, to the application on a motor vehicle of a multifunctional optical sensor of the type mentioned above, which can be positioned for example:

in proximity to the windshield, e.g. in the interior rear-view mirror, to carry out, for example, the following functions: measurement of environmental illumination or entry into a gallery, measurement of solar irradiation, detection of the presence of raindrops on the windshield, detection of conditions of internal or external fogging of the windshield, detection of the presence of ice, detection of fog conditions and monitoring the scene in front of the vehicle (vehicle crossing); additional functions which can be integrated in addition or alternatively to the vehicle crossing function are the functions: levelling, curve or lane detection (for commanding adaptive headlights or for Lane Warning), night vision (viewing scene in the near-infrared or NIR), detection of vertical road signs, detection of pedestrians, black box (storing images relating to frontal monitoring in a circular memory buffer which can be used in case of accident);

near the rear window, to carry out the following functions: measurement of environmental illumination, rain/fogging (internal and external), ice, fog, rear monitoring (parking); additional functions which can be integrated in addition or alternatively to rear monitoring are: blind angle monitoring, levelling, lane detection, black box;

in the side mirrors to carry out the functions: measurement of environmental illumination, fog, rear monitoring (blind angle); additional functions which can be integrated in addition or alternatively to blind angle monitoring are: parking, levelling, lane detection, black box;

in the uprights of the windshield for the functions of: user identification, occupant monitoring for the air-bag system.

The optical sensor according to the present invention can also be used in other applications, such as: road infrastructures, robotics, domotics, agriculture, etc.

The present invention shall now be described in detail with reference to the operating principles of optical systems.

Figure 2:
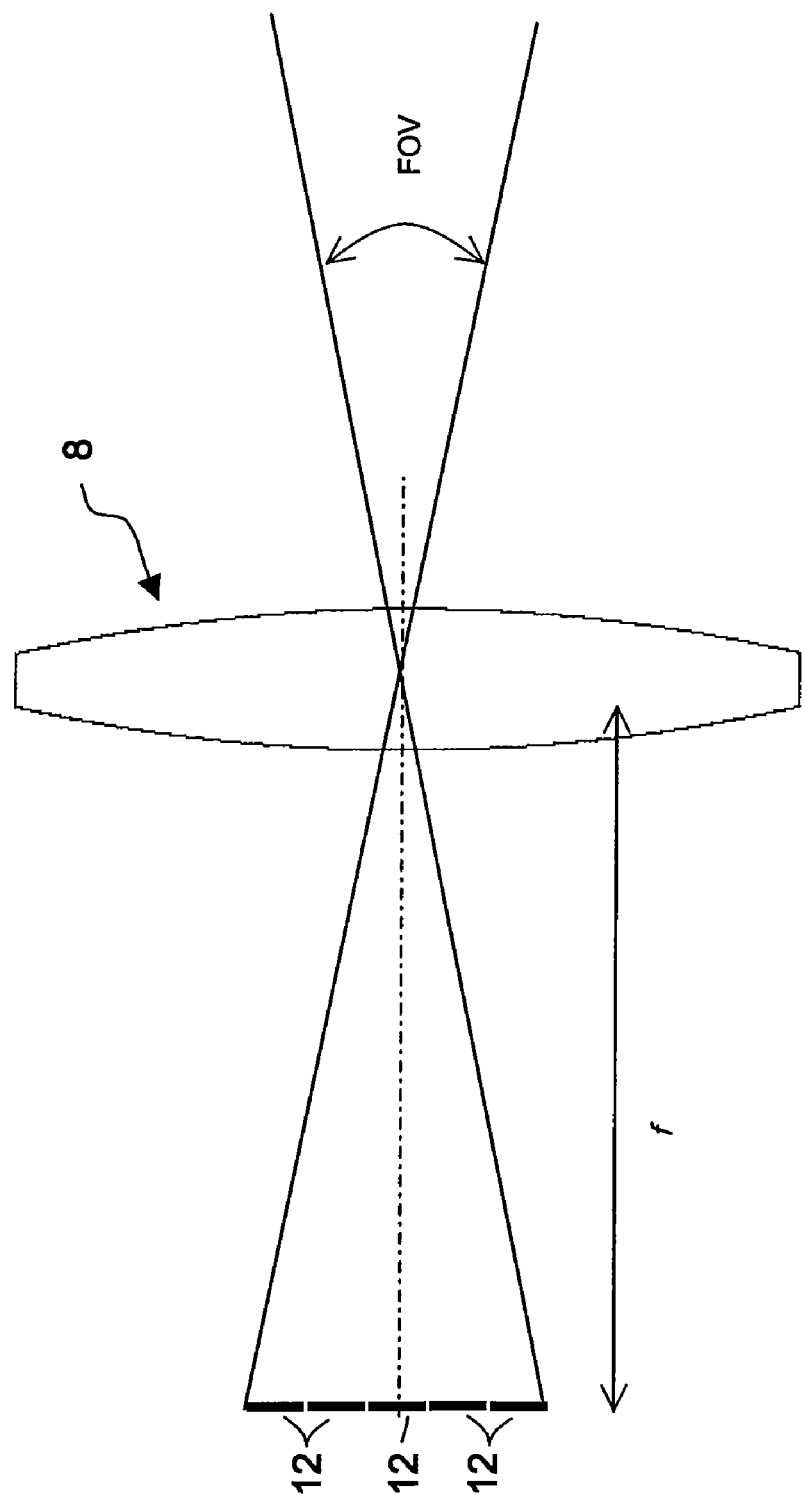
FIG. 2 is a schematic view showing the principle of operation of an optical solution with single aperture.

FIG. 2 shows the single aperture optical solutions whereon are based the documents EP-A-1 418 089 and EP-A-1 521 226: the lens 8 has a field of view FOV=2·arc tan(d/2f) where $d = n \cdot d_{pixel}$ is the total dimension of the photodetector matrix 12, $d_{pixel}$ is the dimension or pitch of the photodetector 12 and f is the focal length of the optical system.

Figure 3:
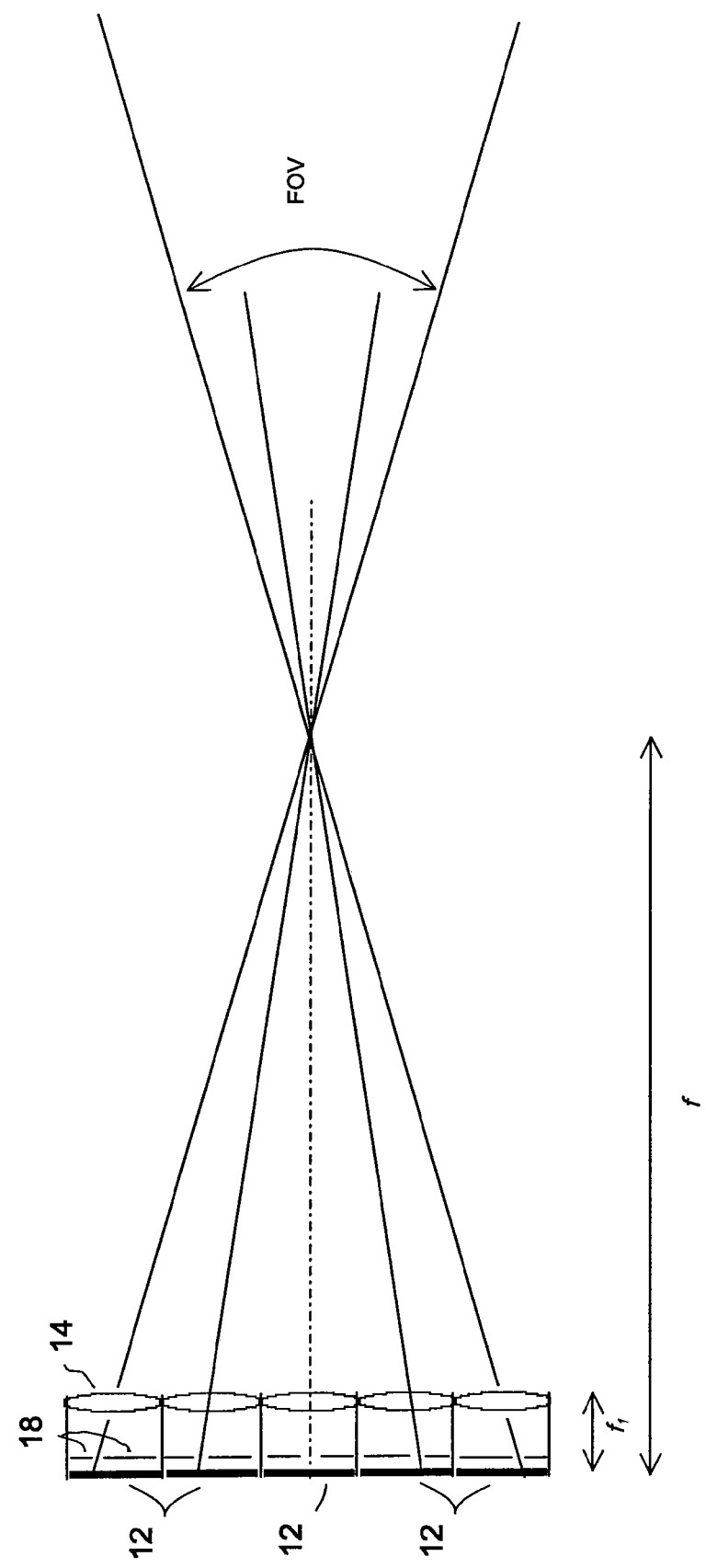
FIG. 3 is a schematic view showing the principle of operation of an optical solution based on microlens matrices.

In general, to reduce the dimensions of the optical system, and in particular the focal length f by a factor n, microlenses 14 can be used, each coupled to a photodetector 12, with linear dimension of $d/n = d_{pixel}$ and focal length $f_1 = f/n$ (FIG. 3). In this case, each of the microlenses 14 has a field of view that coincides with the global field of view, $FOV_1 = FOV = 2 \cdot \text{arc tan}(d_{pixel}/2f_1)$.

To have a global field of view FOV that is the resultant of the individual fields of view of each of the microlenses 14 it is necessary to reduce the size of the active area of the photodetectors 12 in such a way that their dimensions are $d_{pixel}/n$ or equivalently to position diaphragms 18 having aperture with dimension $d_{pixel}/n$ in front of the photodetectors 12.

Figure 4:
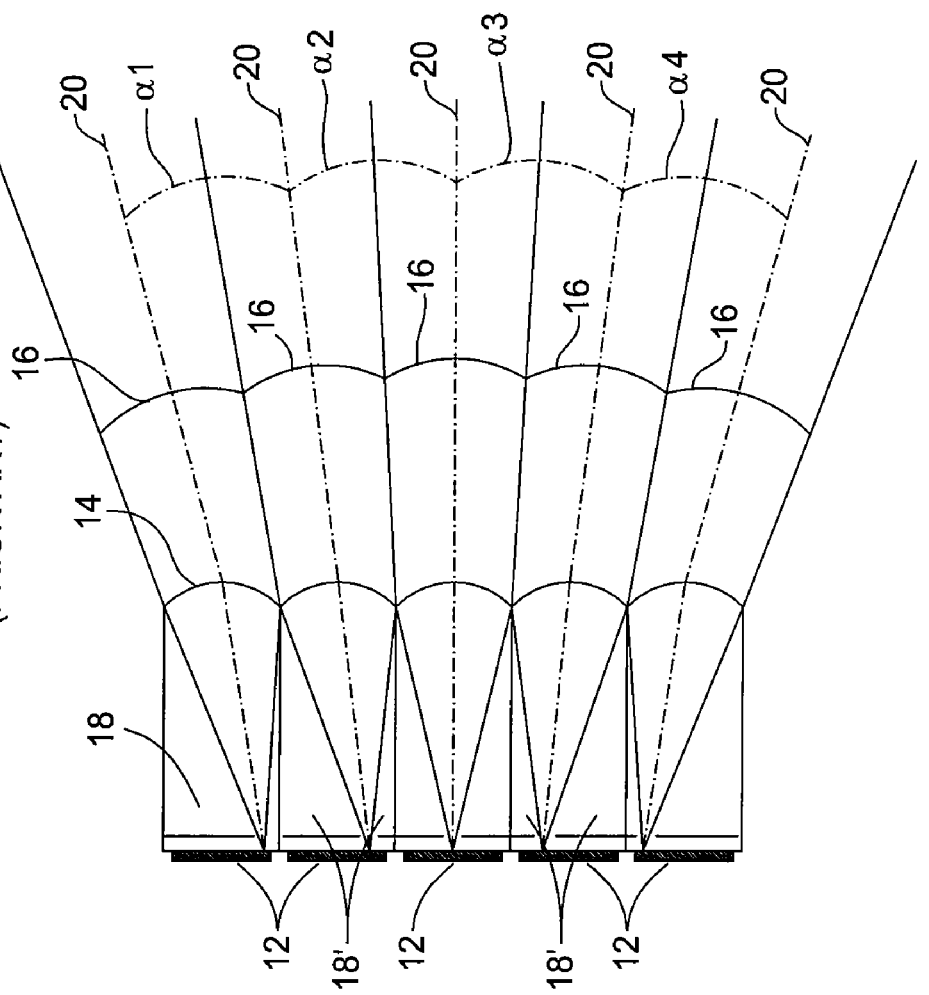
FIG. 4 is a schematic view showing the principle of operation of an optical system based on microlens matrices that constitutes prior art.

If the distance between the centres of the diaphragms 18 is different from the dimensions of the microlenses 14, as shown in FIG. 4 which constitutes prior art, in front of the photodetectors matrix 12 is positioned a matrix of diaphragms 18 such that any microlens 14 has an IFOV 16 with central direction 20 and a constant angular separation αi between the central directions 20 (α1=α2=α3=α4). The sum of the individual IFOV 16 determines the global field of view FOV. Each microlens 14 can also be separated from the contiguous microlens by a "baffle" 18' whose function is to prevent the radiation coming from a contiguous microlens from reaching the non corresponding photodetector.

Figure 5:
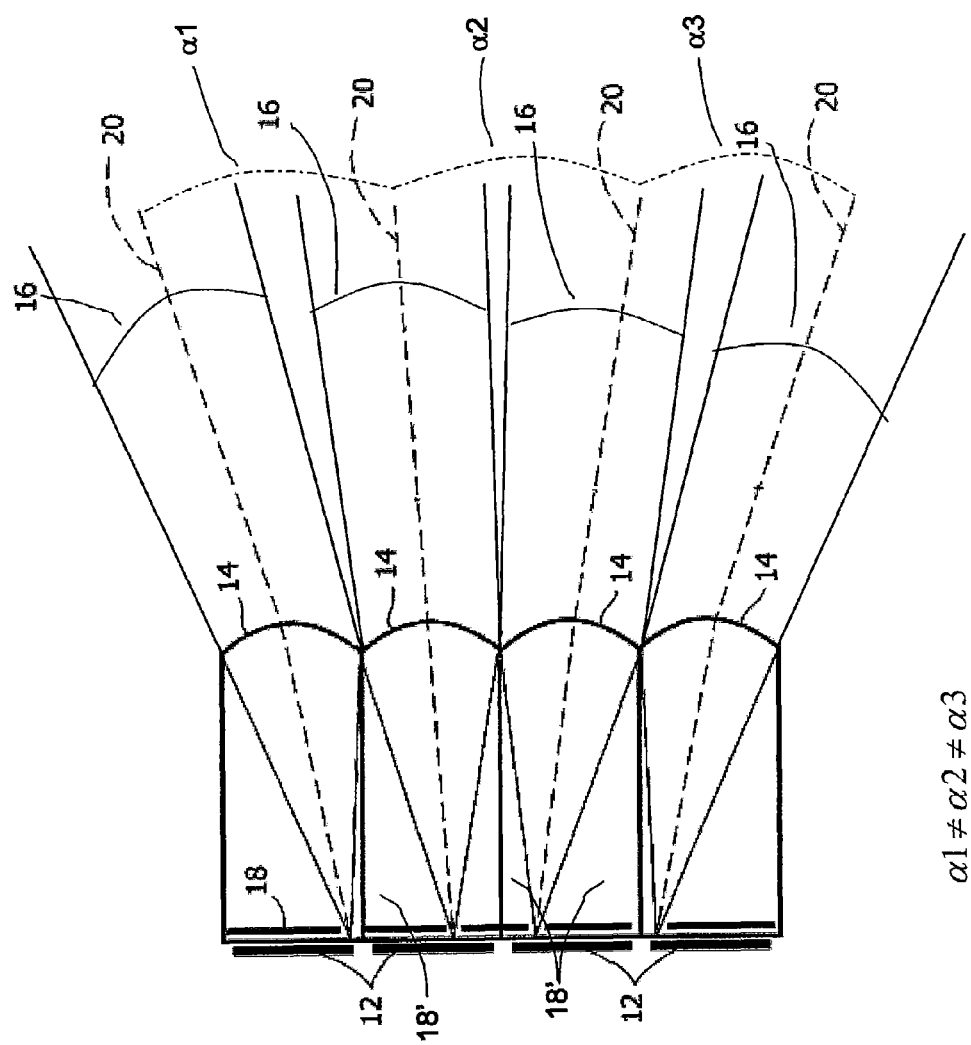
FIG. 5 is a schematic view showing the principle of operation of the optical system of the present invention according to a first embodiment.

If the angular separation αi between the central directions 20 is not to be constant, as contained in claim 1 and shown in FIG. 5, it is necessary to change the distances between the centres of the diaphragms. FIG. 5 schematically shows a lateral view of a portion of an optical sensor 10 which comprises a photodetectors matrix 12 and a microlenses matrix 14 in which the distance between the centres of the diaphragms 18 is different from the distance between the centres of the microlenses 14. Each microlens 14 is associated to a cluster of photodetectors 12 or to a single photodetector. In the example of FIG. 5, the microlenses 14 are mutually identical. Each microlens 14 is set to focalise the radiation coming from a portion of solid angle IFOV 16 on the cluster of photodetectors 12 or on the single photodetector 12 associated to the microlens 14. FIG. 5 shows a matrix of diaphragms 18 positioned between the photodetectors matrix 12 and the microlenses matrix 14. The diaphragm matrix 18 enables to select for each photodetector 12 or cluster of photodetectors 12 the portion of solid angle IFOV 16.

A difference with respect to the case of FIG. 4 is that the angular separation αi between the central directions 20 of the portions of solid angle 16 subtended by the microlenses 14 is not constant. In the example of FIG. 5, the angles between the central directions 20 are designated α1, α2, α3, and they are such that α1≠α2≠α3. The reason for this is that the distance between the centres of the diaphragms 18 is not constant. Another difference is that the total FOV is not the sum of the IFOV 16 and therefore the FOV can be sub-sampled. To prevent the radiation coming from a contiguous microlens 14 from reaching the non corresponding photodetector 12, each microlens 14 can be separated from the contiguous microlens 14 by a "baffle" 18'.

Figure 6:
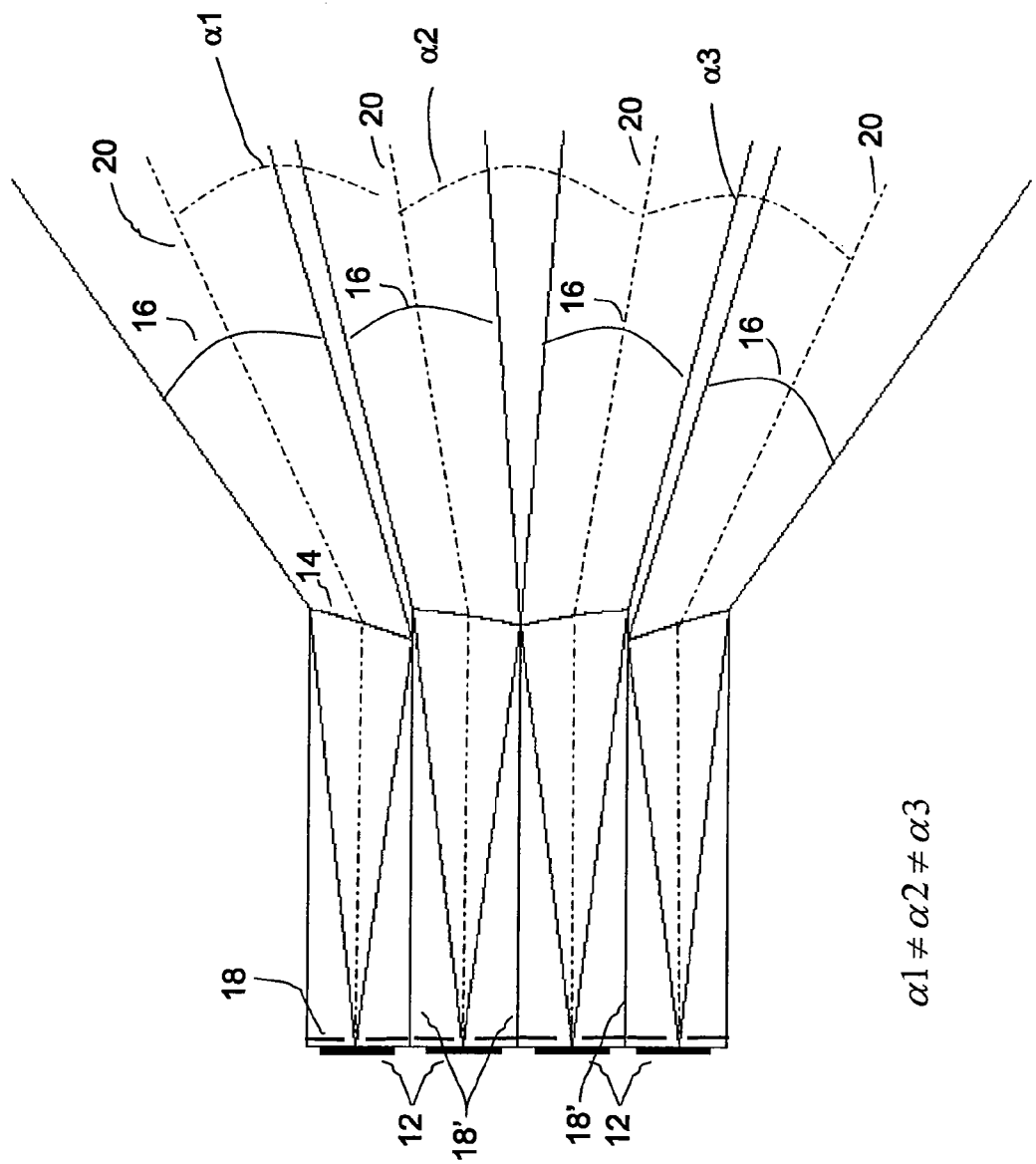
FIG. 6 is a schematic view showing the principle of operation of the optical system of the present invention according to a second embodiment.

If the angular separation αi between the central directions 20 is not to be constant, but the distance between the diaphragms 18 is to be equal to the dimensions of the microlenses 14, as shown in FIG. 6, the microlenses must be calculated adding a prismatic component to the spherical component in order to have microlenses operating with optical axis not coinciding their axis of symmetry (off-axis). The IFOV 16 of each microlens will have such central directions 20 that α1≠α2≠α3. As in the case shown in FIG. 6, the total FOV can be sub-sampled.

In order to cover a field of view larger than what is possible with a refractive optical solution as described above, solutions with microlenses of the kind with total internal reflection, reflexive solutions and mixed solutions can be considered. For example, FIG. 7 shows a microlens 22 operating by total internal reflection associated to refractive off-axis microlenses 14. FIG. 8 shows an optical sensor with a reflexive lens 24 associated to refractive off-axis microlenses 14.

An additional possibility for obtaining a non constant angular separation αi between the central directions 20 is to use a matrix of micro-objectives, as shown in FIG. 9. The micro-objectives 15 are composed by at least two superposed micro-objectives. The doublet optical solution allows to vary effective focal length (e.f.l.) maintaining the back focal length (b.f.l.) equal for all micro-objectives. In this way, the distance between the photodetectors matrix 12 and the micro-objectives matrix 15 is constant (b.f.l.) whilst the possibility of varying e.f.l. allows to have a non constant separation between the central directions 20, i.e. α1≠α2≠α3. In this case, the IFOV are varied at the same time.

For the optical systems described above, a possible alternative to the use of the diaphragms 18 consists of using a matrix with photo-detectors 12 having smaller size than the diaphragms 18. Lastly for equal sizes of the sensitive area of the photodetectors matrix 12 it is possible to have either a high resolution photodetectors matrix 12, or a photodetectors matrix 12 with larger size and hence smaller resolution. As shown in FIG. 10a, using a low resolution photodetectors matrix 12, a diaphragms matrix 18 is used to vary the central direction 20 associated to each microlens 14 (case described in the previous optical solutions). Instead, using a high resolution photodetectors matrix 12, FIG. 10b, only some photodetectors 12, corresponding to the central direction 20 of the microlens 14 to be obtained, are activated, and the others are rendered inactive, with no need to use a diaphragms matrix 18. The advantages of using a high resolution matrix consist of eliminating the diaphragms 18 and being able to reconfigure (also while acquiring the images from the matrix) the active photodetectors in such a way as to change the central directions 20 of the fields of view. The disadvantages are due to the fact that the displacement of the central directions 20 occurs by discrete steps (the minimum pitch is equal to the size of the photodetector 12) and not continuously as when using the diaphragms 18, and that to visualise the images requires pre-processing for addressing the active photodetectors.

The microlenses of the optical sensor according to the present invention can be constituted by GRIN (gradient index) material. On the lower plane of some microlens or of some subgroup of microlenses can be deposited a selective interferential coating operating as a filter to transmit only the wavelengths of interest. For some functions, for example, a NIR (near infrared) LED illuminator can be used, the related spectral band has to be selected with respect to the background.

The photodetectors matrix is in CCD or CMOS technology, standard or with parallel architecture (pre-processing at the photodetector level).

The integration of multiple functions on a photodetectors matrix coupled to a microlenses matrix according to claim 1 is in accordance with the following rules:

each function is associated to a single microlens or to multiple microlenses, not mutually contiguous, or to a single subgroup of mutually contiguous microlenses or to multiple, not mutually contiguous subgroups of microlenses.

each microlens is associated to a single photodetector or to a subgroup (cluster) of photodetectors;

the contiguous photodetectors able to be associated to a function define a sub-area (ROI or Region Of Interest);

some photodetectors can be used only for separating the sub-areas;

the angular separation between the central directions of the fields of view (IFOV) relating to photodetectors or clusters of adjacent photodetectors is not constant within the matrix.

The condition whereby the angular separation between the central directions of the fields of view (IFOV) relating to adjacent photodetectors or clusters of photodetectors is not constant within the matrix occurs in the following cases:

there are adjacent sub-areas dedicated to as many functions in which the fields of view of the sub-areas are different;

at least one of the functions integrated on the photodetectors matrix is associated to a single subgroup of microlenses which subtends a solid angle FOV, but, thanks to the fact that the central direction of the field of view IFOV of each individual microlens can be established independently, contiguous photodetectors or clusters or photodetectors, associated to the subgroup of microlenses, do not always have mutually adjacent IFOV (this case will be described and illustrated more extensively in the subsequent paragraph "Matrix shape");

the microlenses of at least one subgroup have different and mutually contiguous fields of view, in such a way as to obtain a different resolution inside the global field of view of said subgroup (this case will be described and illustrated more extensively in the paragraph "Frontal monitoring");

the microlenses of at least one subgroup have equal but not mutually contiguous fields of view, in such a way as to sample in non continuous fashion the global field of view of said subgroup of microlenses and therefore obtain a different resolution inside the global field of view of said subgroup of microlenses (this case will be described and illustrated more extensively in the paragraph "Frontal monitoring");

The variation in angular separation between the central directions of the fields of view relating to photodetectors or clusters of photodetectors can be obtained:

modifying the distance between the centres of the diaphragms positioned in front of the photodetector or cluster of photodetectors (FIG. 5);

modifying the prismatic component in the case of off-axis microlenses matrices (FIG. 6).

The variation in the field of view of an individual microlens can be obtained:

modifying the diameter of the diaphragms positioned in front of the photodetector or cluster of photodetectors;

using the solution with micro-objectives (FIG. 9).

Based on the above rules, additional innovative elements can be identified, which will be described individually hereafter, relating to:

1. matrix shape;
2. frontal monitoring;
3. zoom;
4. optical pre-processing;
5. matrix partition.

Matrix Shape

Figure 11B:
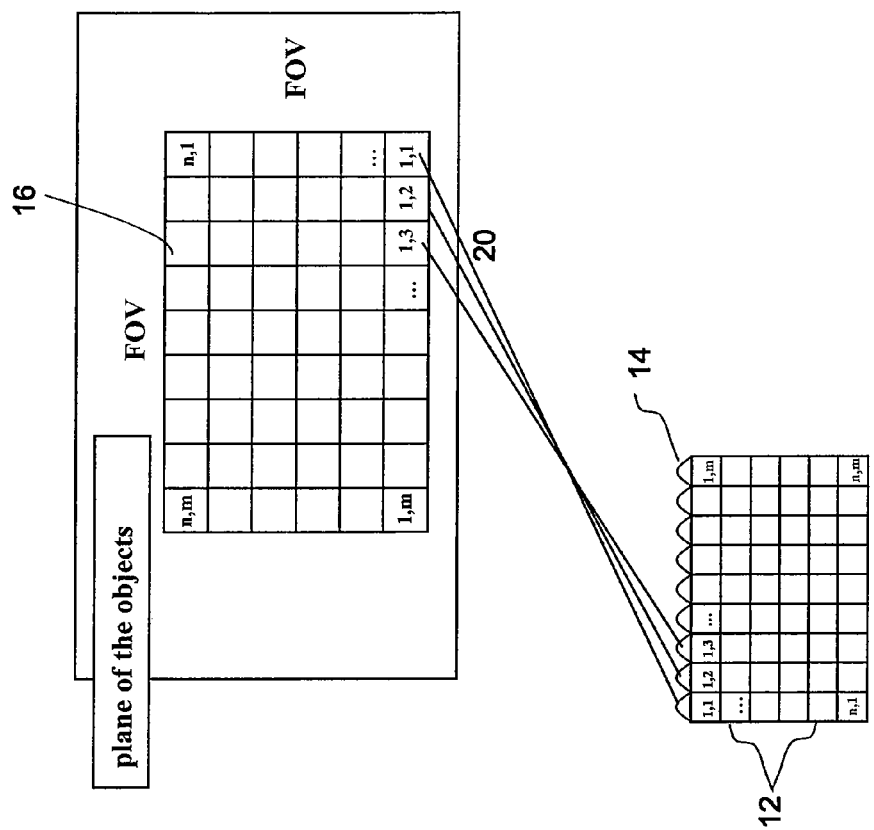
FIG. 11 is a schematic view showing the spaces of the objects and of the images of two optical systems, constituted by a single aperture optics (FIG. 11a) and by a 2D microlens matrix (FIG. 11b), said optical systems being coupled to 2D photodetector matrices with the same format.
Figure 11A:
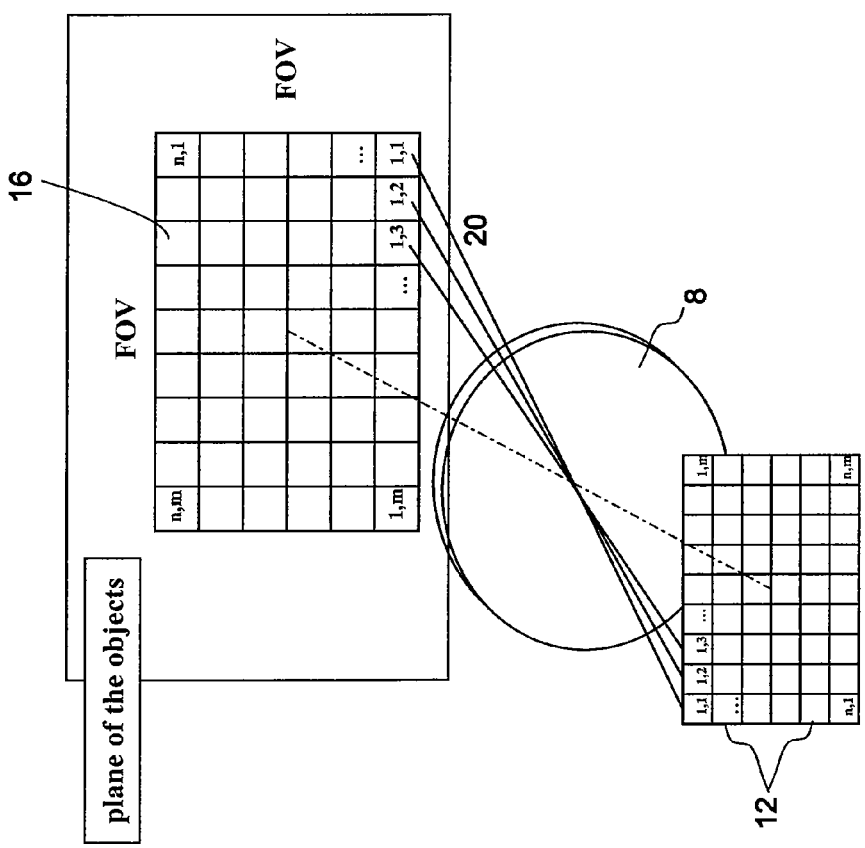

FIG. 11 is a schematic view showing the object and image planes of two optical systems, the first one constituted by a single aperture optics 8 (FIG. 11a) and the second one constituted by a 2D matrix of microlenses 14 (FIG. 11b), said optical systems being coupled to matrices 2D of photodetectors 12, said matrices having the same format mxn.

In FIG. 11a the photodetectors 12 subtend the IFOV according to the laws of geometric optics applied to the lens 8: adjacent portions of the plane of the objects are subtended in the image plane by mutually contiguous photodetectors 12.

In FIG. 11b, which constitutes prior art like the previous FIG. 11a, the single aperture lens is replaced by a microlenses matrix 14 and the previous considerations continues to apply: adjacent portions of the object plane are subtended in the image plane by mutually contiguous photodetectors 12.

However, the central direction 20 of the field of view IFOV of each individual microlens 14 can be established independently. Therefore in FIG. 12 the microlenses 14 are so positioned that the previous rule no longer applies and thus the angular separation between the central directions 20 of the fields of view relating to adjacent photodetectors is not constant within the matrix. However, in this case a pre-processing for addressing the photodetectors is necessary in order to visualise the images.

The previous example can be considered as a generalisation of particular cases, two of which are illustrated below.

Figure 13:
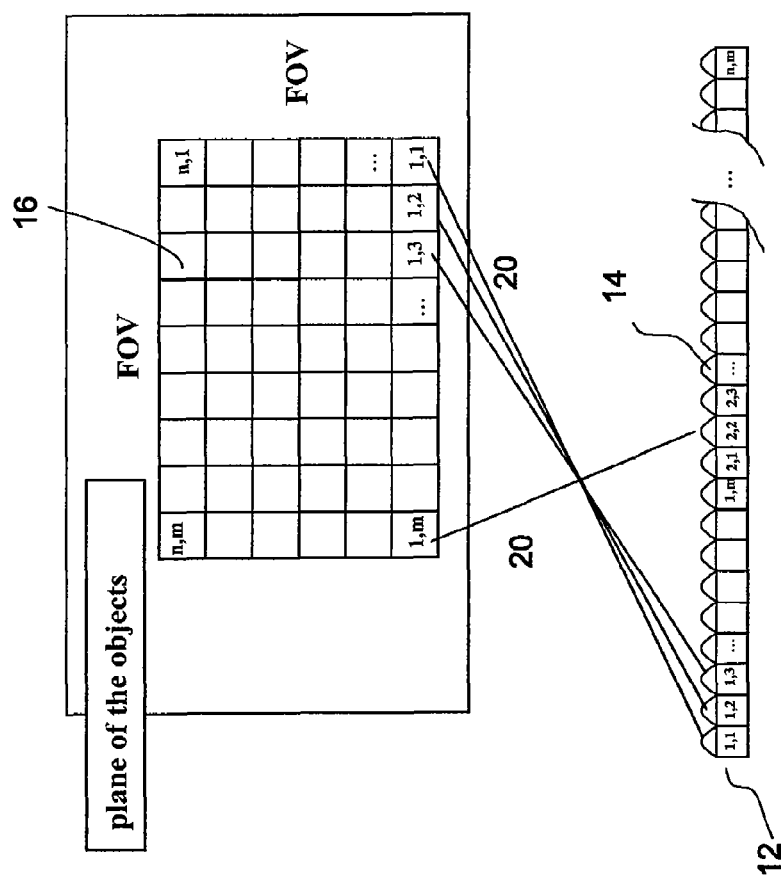
FIG. 13 is a schematic view showing the spaces of the objects and of the images of an optical system constituted by a 1D microlens matrix.

A 2D matrix of mxn photodetectors 12 having a single aperture lens 8 with field of view of x horizontal degrees and y vertical degrees (FIG. 11a) can be redesigned as a 1D linear matrix of mxn photodetectors 12, in such a way that each microlens 14 associated to the corresponding photodetector 12 has a field of view of x/m horizontal degrees and y/n vertical degrees with central direction 20 such as to cover a portion of the global field of view of x horizontal degrees and y vertical degrees (FIG. 13).

This can be useful, for example, when it is necessary to perform the 2D monitoring of a scene and the surface available for integrating the sensor is sufficient only for a 1D linear matrix of mxn photodetectors and not for a 2D matrix of mxn photodetectors.

The fact that the central direction 20 of the field of view IFOV of each individual microlens 14 can be established independently, can be used also to optimise the partition of the photodetectors matrix into sub-areas dedicated to specific functions and in particular to exploit the entire sensitive area of the matrix.

Figure 14:
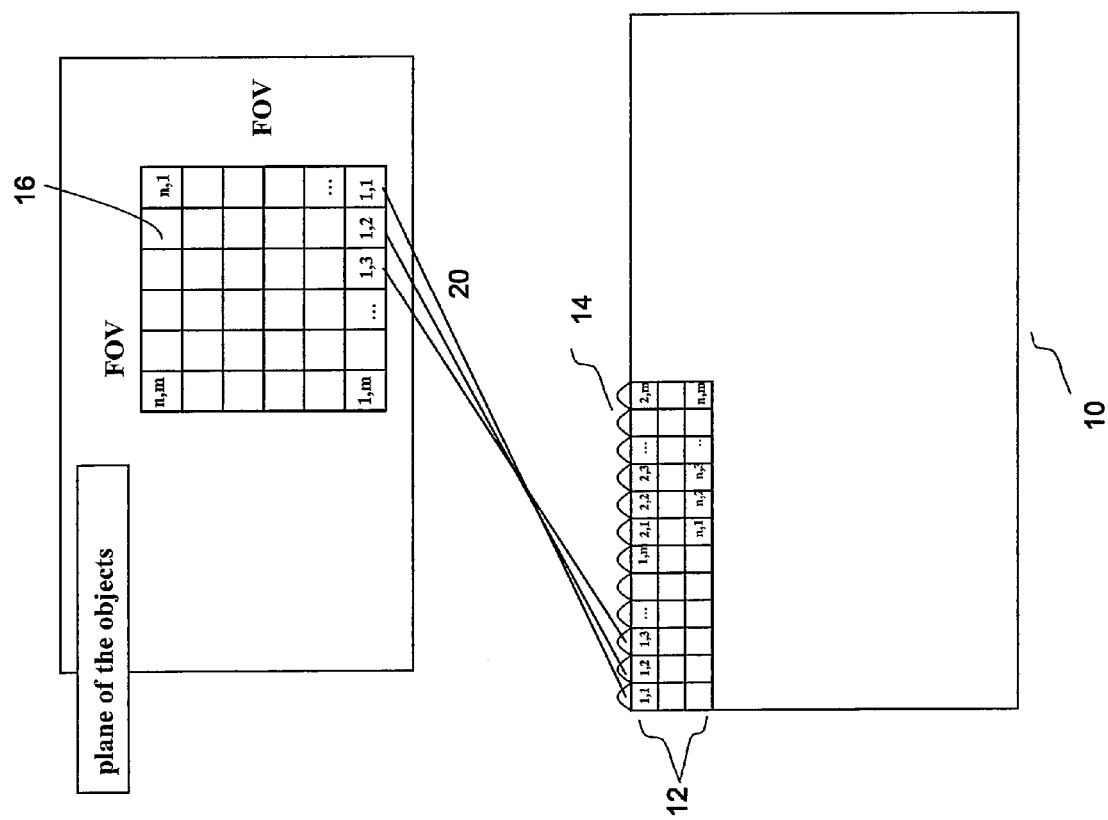
FIG. 14 is another variant of FIG. 11b.

FIG. 14 shows, by way of example, the case in which there is a need to view a portion of scene with a field of view of x horizontal degrees and y vertical degrees, where x=y, and the sub-area available on the sensor 10, constituted by a matrix 2D of photodetectors 12, is rectangular: if the same resolution has to be maintained along the two axes x and y of the object plane, and therefore the same field of view has to be maintained for each microlens 12, the microlenses can be positioned on the rectangular sub-area as shown in FIG. 14.

Frontal Monitoring

The format of the TV camera, used in systems with single aperture lens for monitoring the scene in front of the vehicle, depends mainly on two parameters: field of view FOV and resolution R needed in the areas of the scene in which some objects have to be discriminated with higher precision (e.g., horizontal signs on the road surface). This means that in the other areas of the scene in which there are no objects of interest the previous resolution R is wholly redundant.

For most of the frontal monitoring functions, the format of the camera must be at least CIF (320×256 pixels) or VGA (640×480 pixels).

These formats are not compatible with the optical solutions based on micro-optics matrices proposed above, where the size of the photodetector is in the order of tens of microns, i.e. far larger than that of the photodetectors (less than 10 microns) of the standard matrices used today for consumer or automotive applications. The use of photodetectors, with dimensions in the order of tens of microns, combined with high resolution means excessively expanding the total area of the chip and consequently raising fabrication costs.

Figure 15:
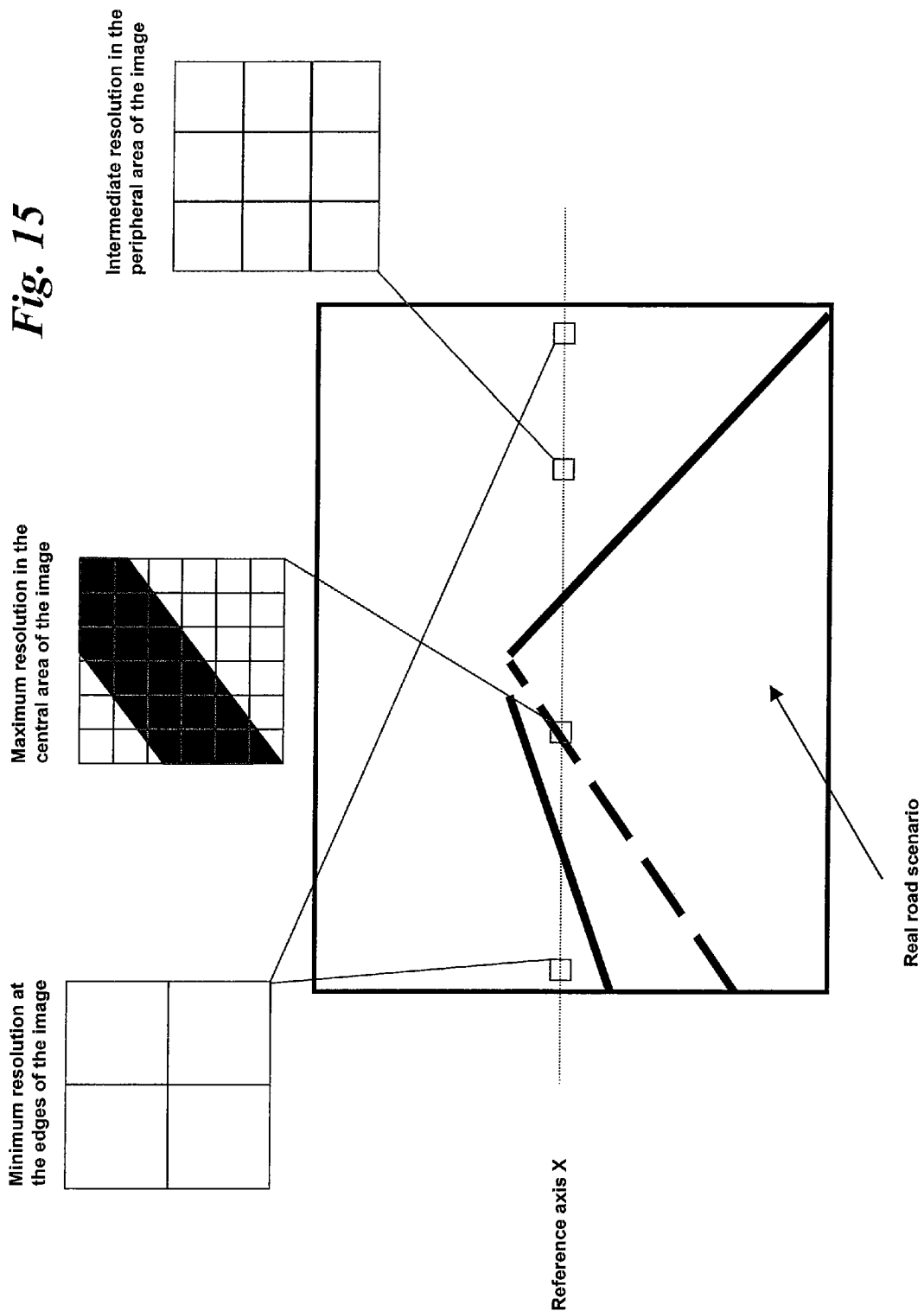
FIG. 15 shows an example of an optical sensor with a matrix of photodetectors with constant dimensions or pitch and microlenses with different field of view on a road scenario.

In the case of optical solutions based on micro-optics matrices, it is necessary to design the subgroup of microlenses, dedicated to the frontal monitoring function, so that the fields of view IFOV of the individual photodetectors (or clusters of photodetectors), mutually contiguous, are not kept constant for the whole field of view FOV of the microlenses subgroup, but they are defined on the basis of the resolutions actually required in the different areas of the scene as shown in FIG. 15. Consequently, the angular separation between the central directions of the fields of view IFOV of the individual mutually contiguous photodetectors (or clusters of photodetectors) is not constant.

Figure 16:
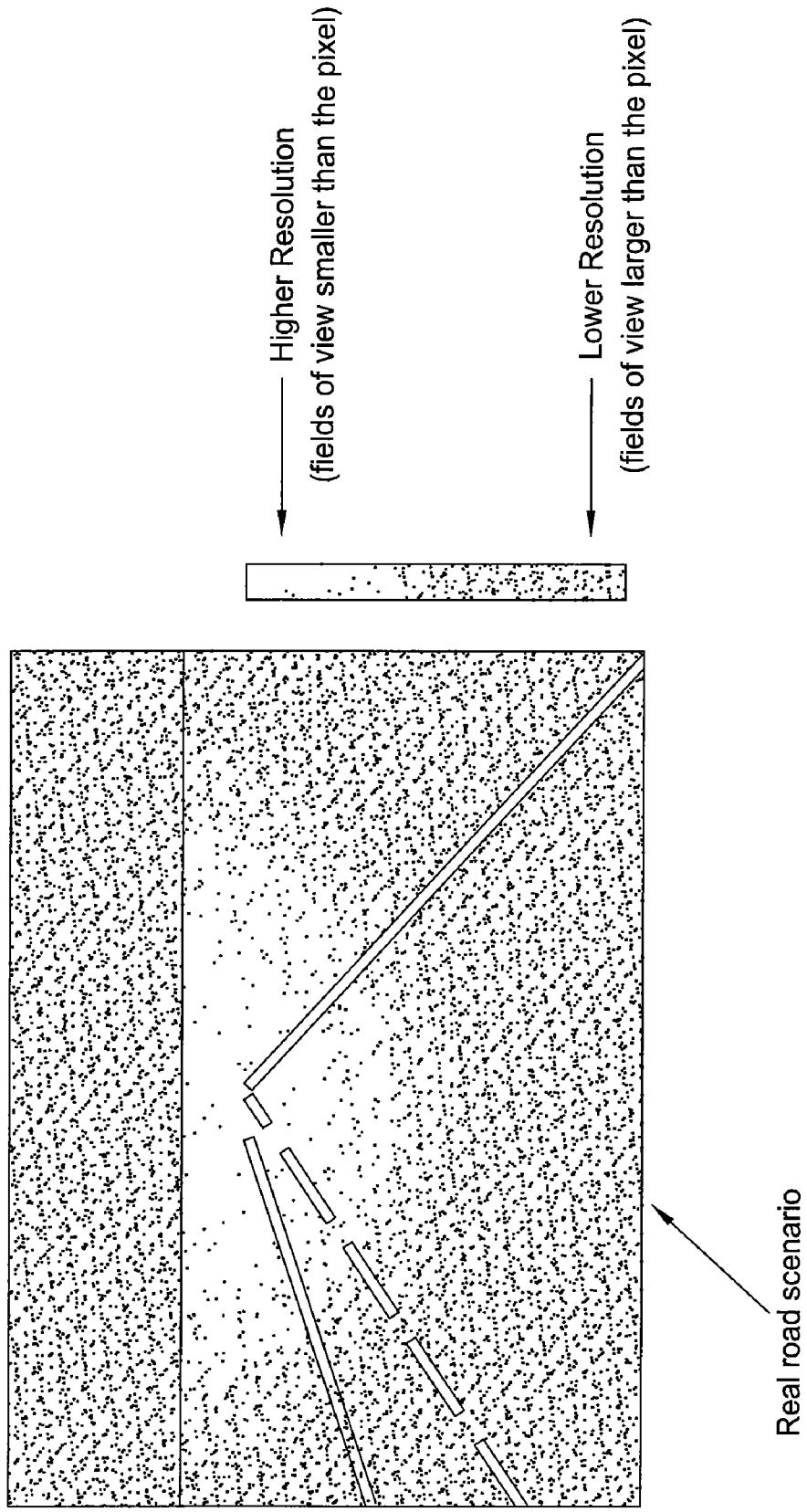
FIG. 16 is an example of application of the optical sensor of FIG. 15 on a road scenario.

This approach enables to define a higher resolution in the point of escape of the images relative to that of the peripheral area, as shown in FIG. 16. Proceeding from the point of escape towards the outer edges of the matrix, both the field of view IFOV of the individual photodetectors (or of the photodetectors clusters) and the angular separation between the central direction of the IFOV increase, or else only the angular separation between the central directions of the IFOV increases, whilst the IFOV are instead maintained constant, in order to sample non continuously the portion of the scene that requires a lower resolution.

Zoom

The frontal scene monitoring functions are manifold (vehicle crossing, Lane Warning, curve detection, vertical signs detection, pedestrian monitoring, etc.).

To integrate all these functions on a same photodetectors matrix, coupled with a single aperture lens, it is first of all necessary to evaluate the functional specifications in terms of field of view, minimum and maximum range, resolution of a reference obstacle at the maximum distance. Combining these specifications enables to define the format of the matrix, which will obviously be sufficient for some functions and redundant for others. With this approach, the format of the camera will definitely be greater than VGA.

Figure 1:
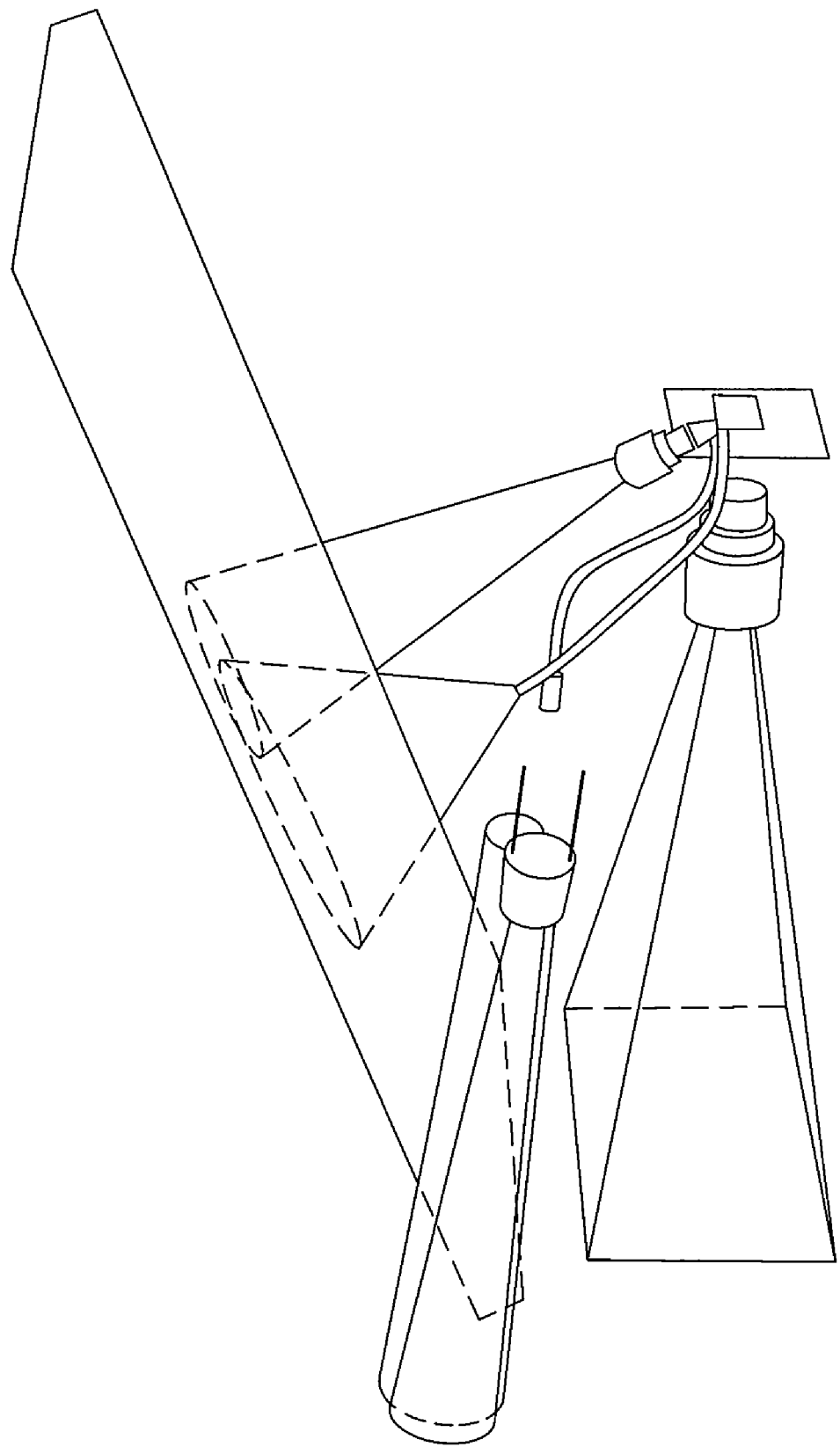
FIG. 1 shows a perspective view of an embodiment of the sensor according to the invention of the document EP-A-1 418 089.

An alternative that reduces the format of the TV camera entails the use of an optical zoom. However, the size and complexity of an optical zoom make it difficult to integrate it with other optical systems dedicated to the environmental parameters measuring functions (note the complexity of the optical sensor shown in FIG. 1, according to the invention of the document EP-A-1 418 089). Moreover, the optical zoom increase the fabrication costs of the sensor.

If a matrix of microlenses is used instead of single aperture optical systems, the sub-area dedicated to frontal scene monitoring can be optimised, increasing resolution in the areas where details need to be discriminated (horizontal signs, obstacle recognition, etc.) and reducing it in the areas where the necessary information is more qualitative (road edges, horizon, etc.). This is equivalent to processing the images with the optimal resolution, as is made possible by an optical zoom.

The solutions for varying resolutions have already been discussed in the previous paragraph "Frontal monitoring".

Optical Pre-Processing

The ability to design the microlenses matrix defining the direction and amplitude of the field of view for each of them allows to simplify image processing.

A possible optical pre-processing function consists of applying optical filters in order to pre-transform the image for subsequent processing. With a single aperture optics, a high resolution is required even in non significant areas in order to have sufficient resolution to identify some areas of the images. Instead, using different fields of view for each microlens or subgroups of microlenses, it is possible to define the sub-areas of the matrix with appropriate resolution and field of view, in order to simplify the image processing operation.

Figure 17:
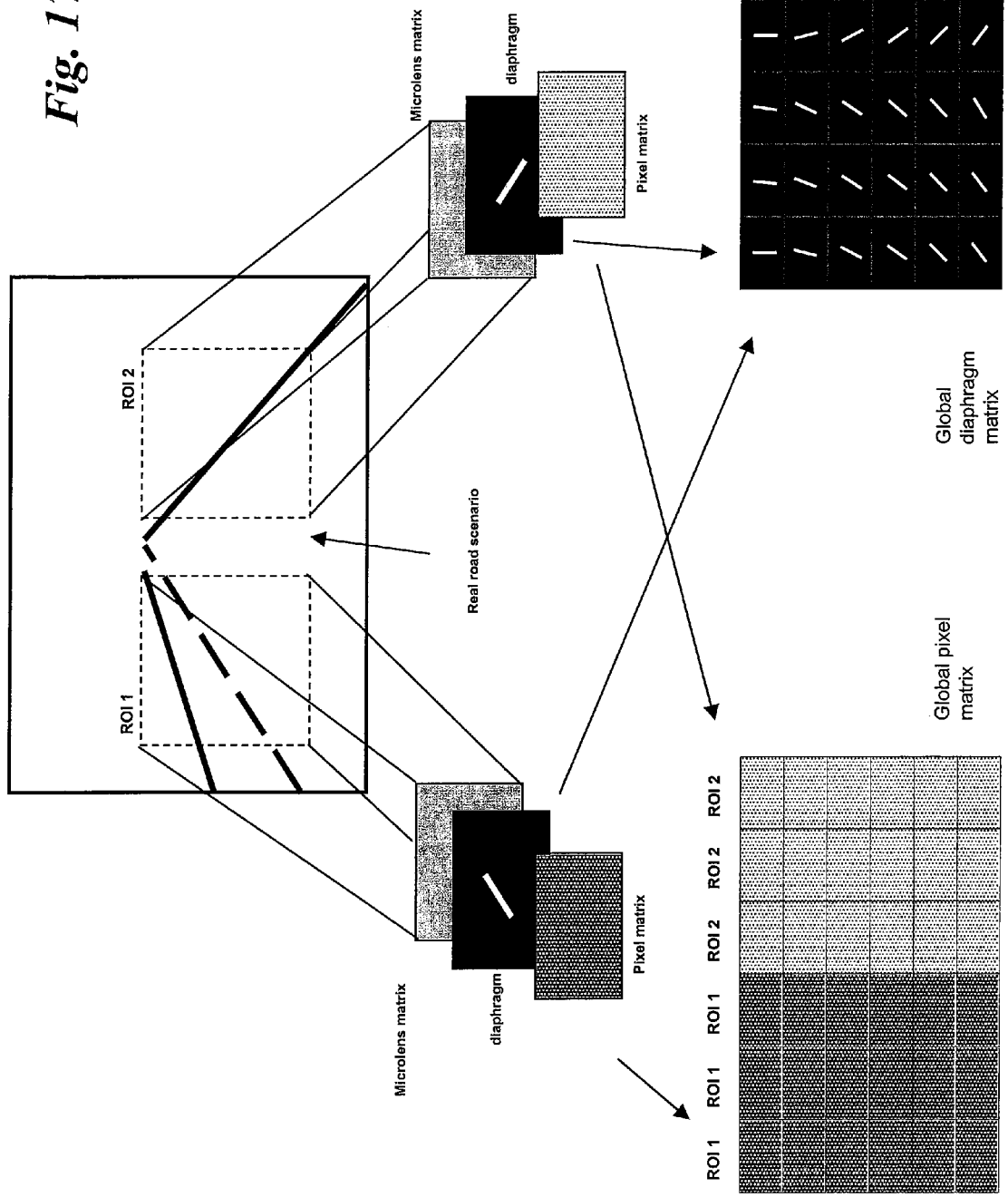
FIG. 17 is an example of a matrix of subgroups of photodetectors that frame the same portion of scene or different portions of scene.

With reference to FIG. 17, an additional possibility consists of defining on the sensitive area of the matrix k groups of j photodetectors, each able to create (by means of a single microlens or a matrix of j microlenses) the image of the same portion of scene or of different portions of scene. On each group of j photodetectors are positioned diaphragms with different shapes. When a group of photodetectors frames a portion of scene that matches the shape of the diaphragm, the signal is the highest. This approach can be used, for example, for the Lane Warning function, as shown in FIG. 17, in which there are k/2 groups of j photodetectors which view the left part of the road scenario (type 1 region of interest) and k/2 groups of j photodetectors which view the right part of the road scenario (type 2 region of interest).

Figure 12:
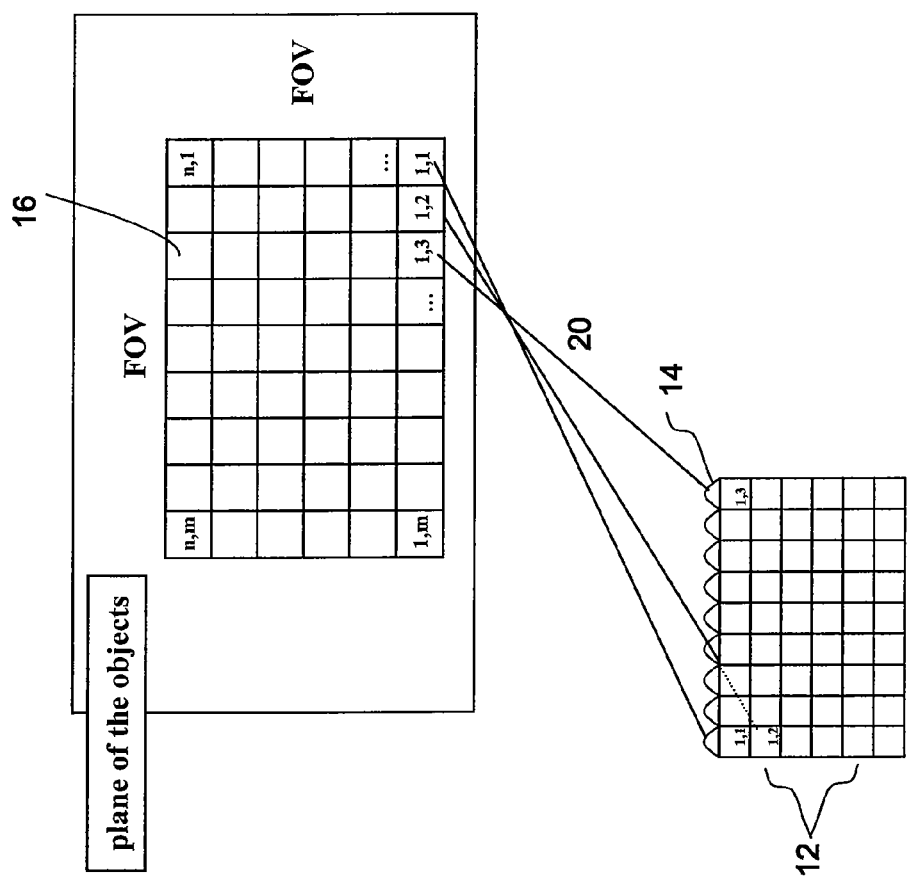
FIG. 12 is a variant of FIG. 11b.

The example shown in FIG. 12 can now be analysed from a different viewpoint. As explained above, the microlenses 14 are so positioned that adjacent portions of the object plane are not subtended, in the image plane, by mutually contiguous photodetectors 12 and, therefore, the angular separation between the central directions 20 of the fields of view relating to adjacent photodetectors 12 is not constant within the matrix. Based on this general example, it is possible to design k subgroups of microlenses with such field of view as to view k portions of the scene which exactly match the shape of the diaphragms of FIG. 17, to select k positions of the horizontal demarcation lines. Said k subgroups of microlenses, however, are positioned horizontally on the photodetectors matrix: the first subgroup starting from the top left corner of the matrix and proceeding rightwards, the second one starting from the end of the first subgroup and proceeding rightwards and so on; reaching the right edge of the matrix, the subsequent line is started.

Figure 18:
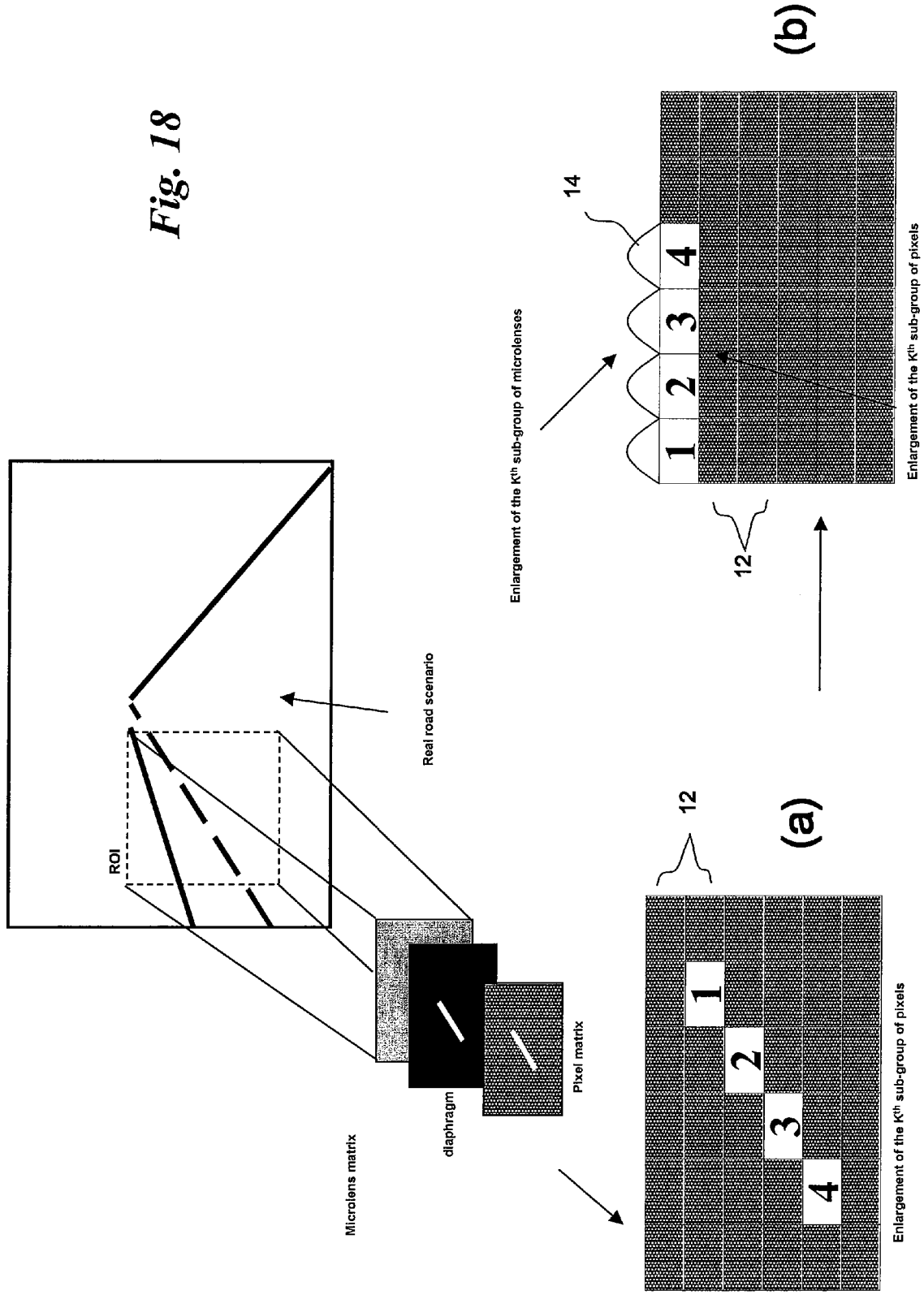
FIG. 18 is a variant of the use of the diaphragms of FIG. 17 for optical pre-processing functions.

FIG. 18a shows the enlargement of both the subgroup of photodetectors relating to an ROI and of the photodetectors actually exposed to the radiation that passes through diaphragm. FIG. 18b shows the positioning of the kth subgroup of microlenses as described above.

The advantages of this solution are: the removal of the diaphragms of FIG. 17, the use of a matrix with smaller format, the elimination of any form of pre-processing for addressing the photodetectors, mentioned in the example of FIG. 12.

Matrix Partition

The partition of the sensitive area of the photodetectors matrix can have different configurations according to the number and type of integrated functions.

Figure 19:
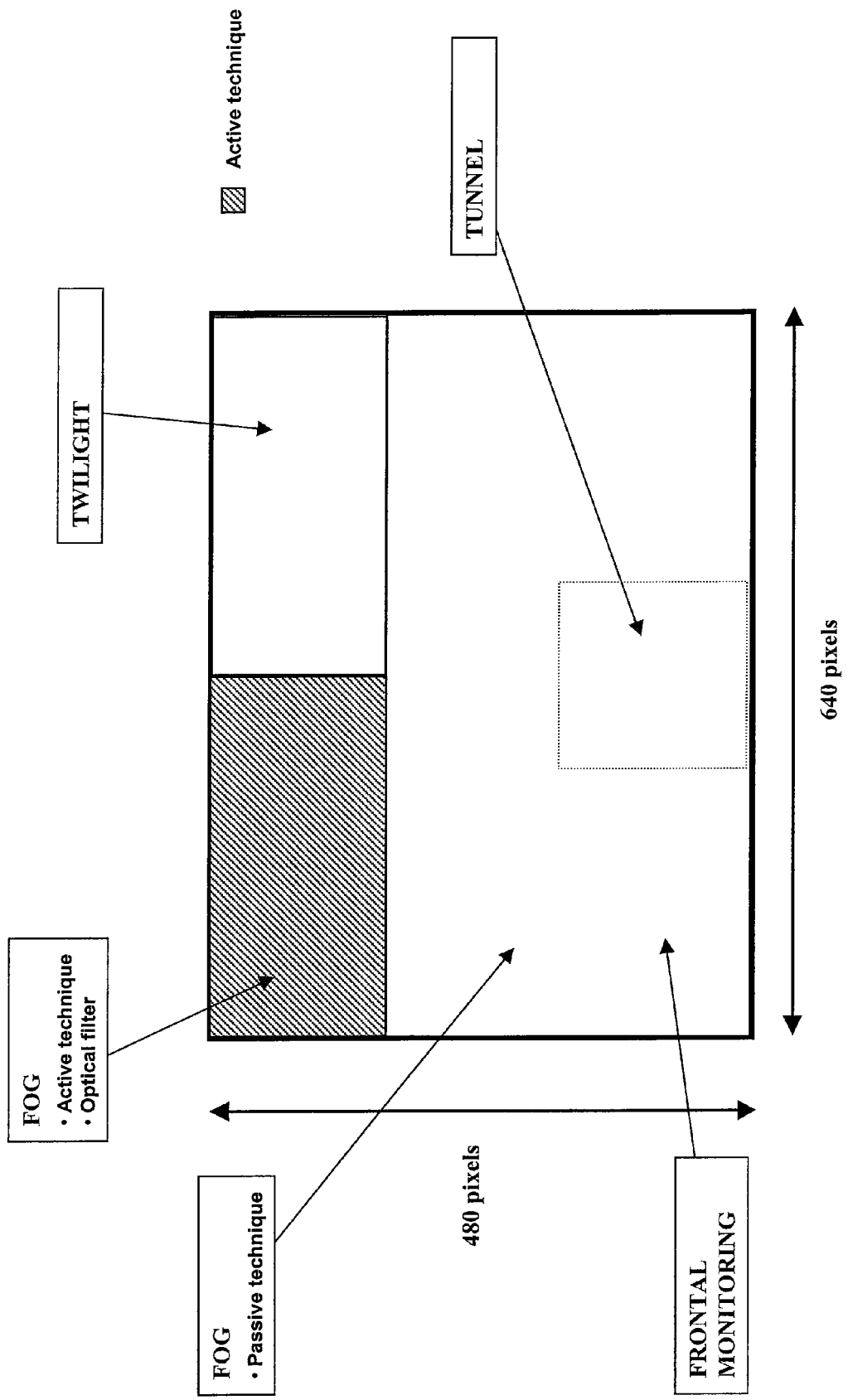
FIGS. 19 and 20 show two examples of partition in sub-areas of the sensitive area of the photodetector matrix, previously described in the document EP-A-1 418 089 by the same Applicant.

FIG. 19 shows, by way of example, a first possible partition of the sensitive area of the photodetectors matrix, already mentioned in the document EP-A-1 418 089 by the same Applicant. The same functions can be integrated differently according to the inventive elements of the present patent application.

The so-called "twilight" function is performed by a sub-area of the matrix that has to measure environmental illumination. The number of photodetectors dedicated to this function can even be reduced to just one and there are no constraints in terms of positioning on the sensitive area of the matrix. According to a preferred characteristic, a central photodetector (or a few photodetectors) is surrounded (are surrounded) by eight or more photodetectors that have different fields of view, the central one(s) larger and the lateral ones smaller, in order to have information both about the intensity of environmental lighting (central photodetector(s)) and about the intensity and direction of solar irradiation (lateral photodetectors). The information about environmental illumination enables automatically to turn on/off the headlights of the vehicles in conditions of poor illumination. The information on the direction of the solar illumination enables to optimise the air conditioning system of the vehicle, e.g. for activating and regulating the air flows of multi-zone air conditioning systems. According to an additional preferred characteristic, some photodetectors are oriented towards the dashboard of the vehicle to measure the radiation directed thereon (diffused radiation on the photodetectors). The photodetectors dedicated to the illumination and solar irradiation function can be positioned separately from each other, i.e. in non contiguous positions.

With regard to the fog detection function (based on active technique), the number of photodetectors can even be reduced to just one and there are no constraints in terms of positioning on the sensitive area of the matrix.

For the tunnel function, the number of photodetectors can even be reduced to just one and there are no constraints in terms of positioning on the sensitive area of the matrix. According to a preferred characteristic, a photodetector (a few photodetectors) has (have) a frontal field of view of about 20° and a second photodetector (a few photodetectors) a smaller field of view, e.g. about 10°.

The sub-area of the sensitive matrix marked with "frontal monitoring" performs the so-called "Lane Warning" function. Preferably, the area of interest (i.e. the area that is used effectively for image processing) is a trapezoid and therefore the number of photodetectors dedicated to this function is reduced from the one described in the document EP-A-1 418 089 by the same Applicant. Preferably, the field of view of the photodetectors are smaller (higher resolution) in the areas of the images in which the lane demarcation lines could be located. This enables to reduce the number of photodetectors dedicated to this functions.

The area called "frontal monitoring", alternatively or in addition to the "Lane Warning" function, can be dedicated to the vehicle crossing detection function. According to a preferred characteristic, the area of interest (i.e. the area that is used effectively for image processing) is a trapezoid and therefore the number of photodetectors dedicated to this function is reduced from the one described in the document EP-A-1 418 089 by the same Applicant. The fields of view of the photodetectors are smaller (higher resolution) in the areas of the image where the potential indicators of the presence of headlights of a crossed vehicle or of taillights of a vehicle that precedes the reference vehicle (the one whereon the sensor is mounted) could be located. According to a preferred characteristic, two subgroups of photodetectors are provided to perform this function: the photodetectors of the first subgroup have fields of view that assure long range monitoring of the scene to detect vehicles that arrive from the opposite lane, and the photodetectors of the second subgroup have fields of view that assure short range monitoring of the scene to detect the vehicles that precede the reference vehicle.

According to a preferred characteristic, a set of photodetectors positioned in the unused areas of the sub-area for the frontal monitoring function can be dedicated to lateral monitoring i.e. to the detection of the presence of a curve for commanding the adaptive headlights of the vehicle.

The portion of sensitive area called "frontal monitoring" can serve a combination of multiple functions, e.g. Lane Warning, vehicle crossing, curve detection, etc. The sub-area dedicated to such functions is preferably constituted by photodetectors whose microlenses have optimised directions and fields of view: high resolution only in the areas where the objects of interest for the processing algorithms could be located, low resolution in non interesting areas (e.g. the horizon). The result is comparable to the one that would be obtained with an optical zoom.

Figure 20:
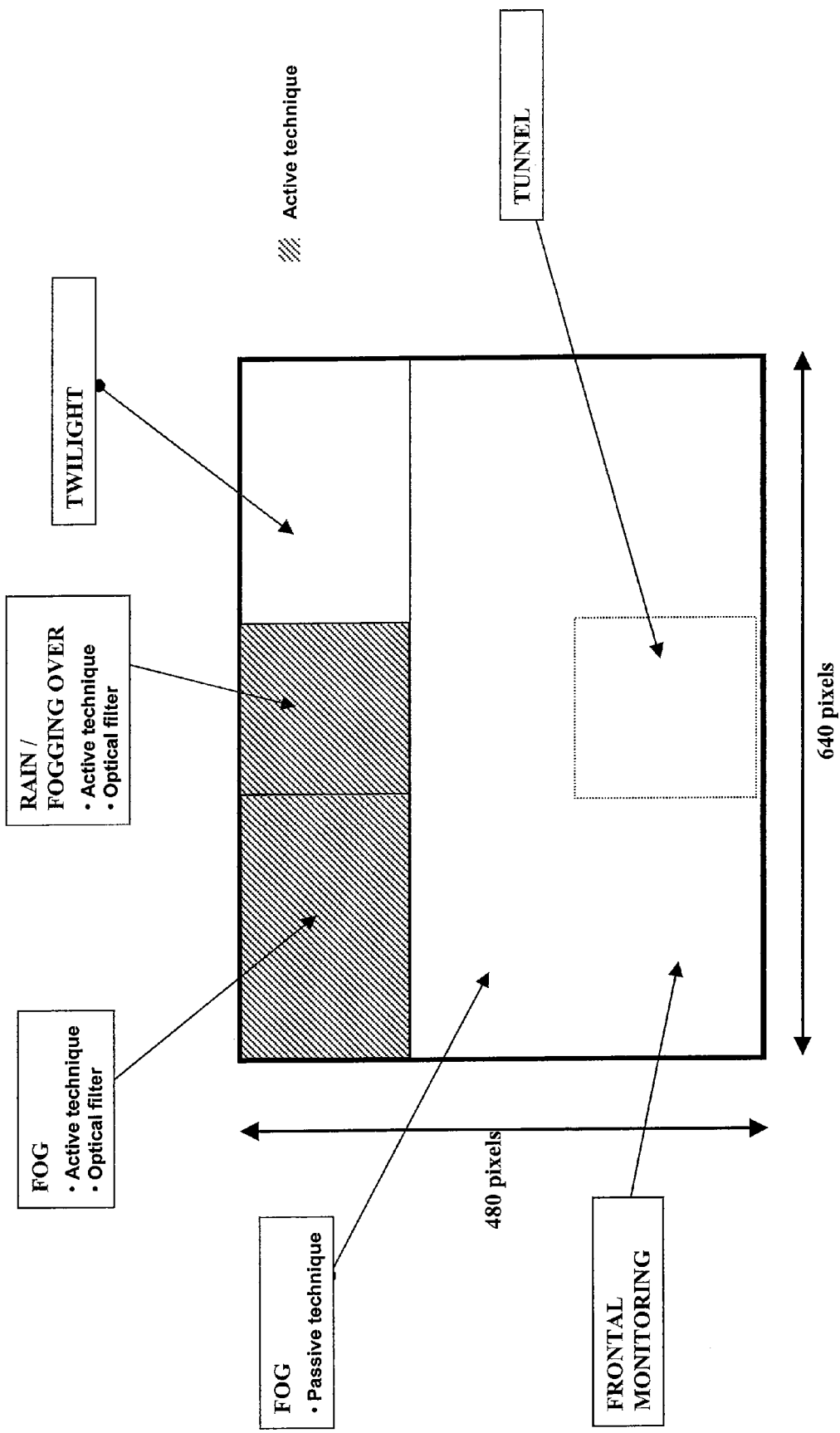

FIG. 20 shows a second example of partition of the sensitive area of the photodetectors matrix, already described in the document EP-A-1 418 089 by the same Applicant. The same functions can be integrated according to the inventive elements of the present patent application.

Figure 21:
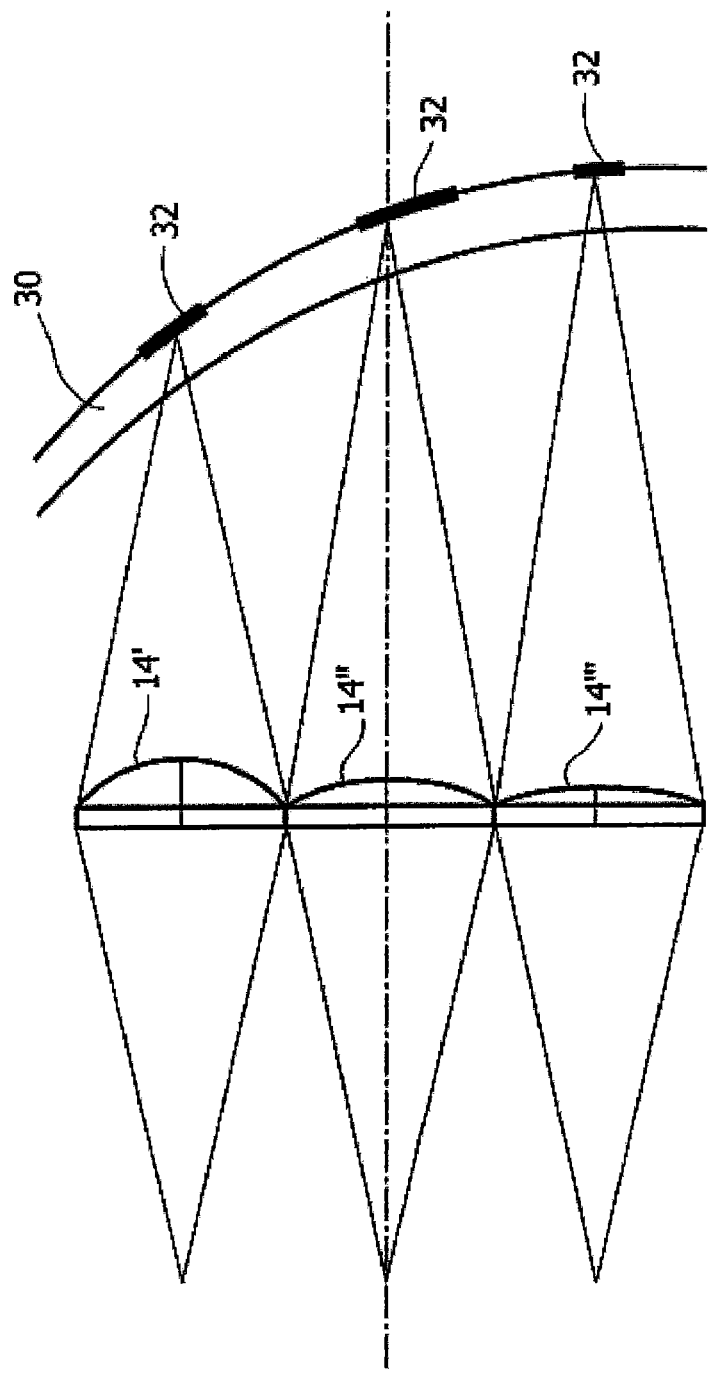
FIG. 21 schematically shows an optical solution for detecting rain based on a matrix of microlenses with different focal length.

For the rain/fogging function, there are no constraints in terms of positioning on the sensitive area of the matrix. In the solution described in the document EP-A-1 418 089, in order to have the rain drops on a same image plane, the optical axis had to be perpendicular to the windshield. According to the present invention, the use of microlenses allows to maintain the optical axis of the microlenses matrix parallel to the road plane. It is possible to compensate for the different distance between the photodetectors matrix and the windshield whereon the rain drops lie by designing microlenses with different focal length, as shown in the schematic representation of FIG. 21. In this figure, the windshield of the vehicle is designated by the number 30. The number 32 schematically indicates water drops deposited on the outer surface of the windshield. The references 14', 14", 14'" designate microlenses with different focal length positioned in such a way that the respective focalisation points fall on the plane of the photodetectors independently of the different distance of the microlenses relative to the windshield.

Figure 22:
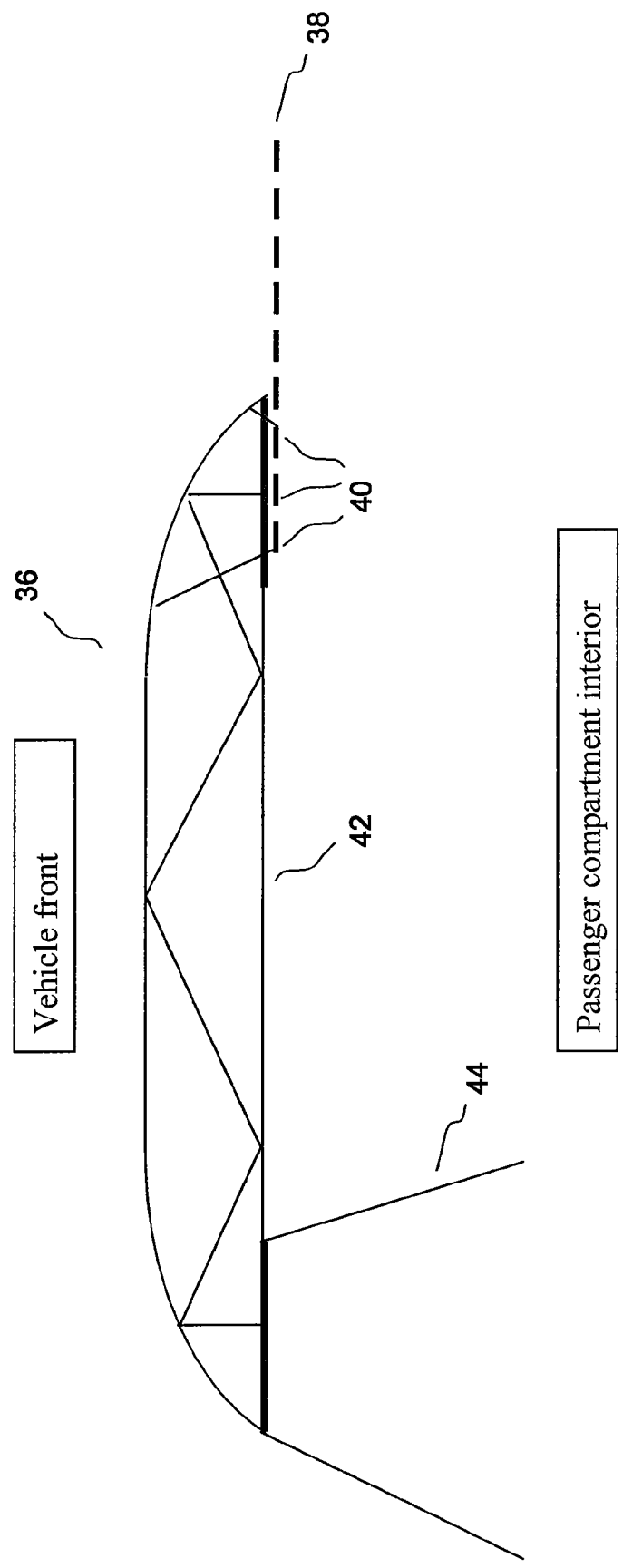
FIG. 22 shows an example of light wave guide coupled to the photodetector matrix to perform the function of monitoring the occupant of the vehicle.

With reference to FIG. 22, the number 36 designates device able to perform the function of monitoring the vehicle occupant. The photodetectors matrix, designated by the reference 38, is oriented towards the front of the vehicle. Some photodetectors 40, e.g. positioned in the bottom left and right corner of the matrix 38, are used to determine the position of the driver and the presence, type and position of the passenger. Since this function does not require optics capable of creating the image of the entire vehicle but only of monitoring and discriminating the presence of passengers, a number of photodetectors equal, for example, to 9 is indicated. Since the interior of the vehicle is positioned to the rear of the active side of the photodetectors matrix 38, to view the scene an optical system 42 is used, able to receive the image positioned to the rear of the photodetectors matrix. For instance, the optical system 42 can be a wave guide element as shown in FIG. 22. Alternatively, the optical system 42 can comprise prismatic elements (not shown). The field of view of the optical system is designated by the reference number 44.

Figure 23:
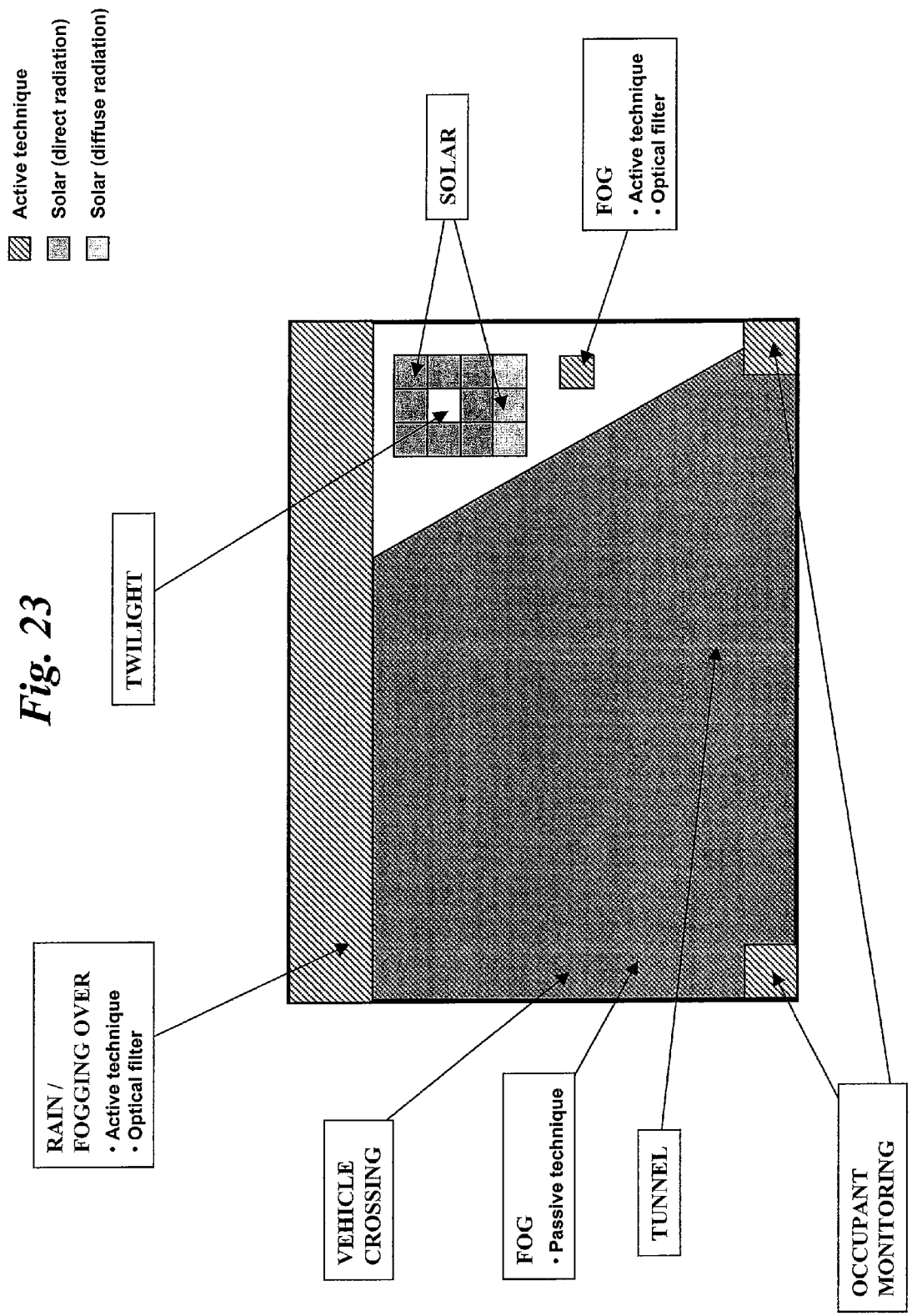
FIG. 23 shows an example of partition into sub-areas of the sensitive area of the photodetector matrix according to a preferred characteristic of the present invention.

FIG. 23 shows an additional possibility of partition of the useful surface of the photodetectors matrix. This partition enables to integrate a higher number of functions on a matrix with a reduced format (e.g., CIF).

Figure 24:
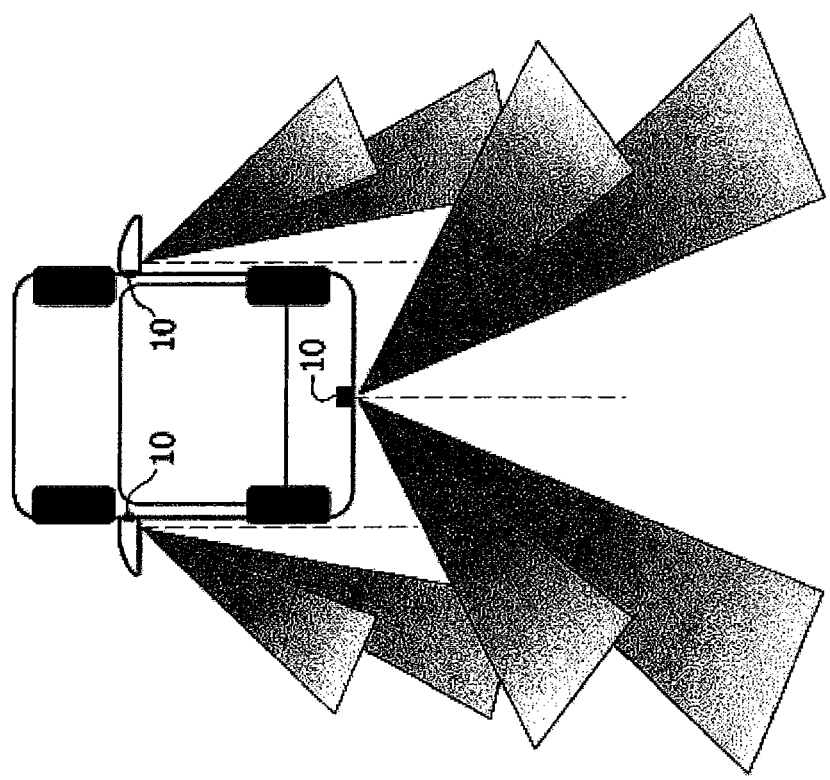
FIG. 24 shows the possible positioning on the vehicle of multifunction sensors for the "blind angle" function according to the present invention.

FIG. 24 shows the possible arrangement of sensors 10 according to the present invention for performing the function of viewing the blind angle. According to a preferred characteristic of the invention, to perform this function each sensor 10 can have two different fields of view to cover different directions and distances, so that the arriving vehicle crosses the two beams at different times, generating a stepped signal that can be used to signal the danger.

The invention claimed is:

1. A multifunctional optical sensor, comprising a matrix of photodetectors of the CCD or CMOS type, having a sensitive area divided into sub-areas, each of which, individually or combined with others, is dedicated to a specific function of monitoring the scene observed by the sensor or measuring environmental parameters, wherein said optical sensor comprising a matrix of microlenses, each microlens being set to focus radiation coming from a portion of solid angle field of view on the associated photodetector or cluster of mutually contiguous photodetectors, each function is associated to a single microlens or to a single subgroup of mutually contiguous microlenses or to multiple, not mutually contiguous microlenses or to not mutually contiguous subgroups of microlenses, the contiguous photodetectors able to be associated to a function defining a sub-area, which is a region of interest (ROI), and the angular separation between the central directions of the portions of solid angle subtended by adjacent photodetectors or adjacent clusters of photodetectors is not constant within the matrix, wherein the not constant angular separation is provided by the sensor comprising a matrix of diaphragms being positioned between the photodetectors matrix and the microlenses matrix, the distances between the centres of the diaphragms being different from the dimensions of the microlenses, whereby said matrix of diaphragms by changing the distances between the centres of the diaphragms enables to select for each photodetector or cluster of photodetectors a portion of the solid angle subtended by each microlens.

2. The optical sensor as claimed in claim 1, wherein a separation baffle is present between contiguous microlenses.

3. The optical sensor as claimed in claim 1, wherein adjacent sub-areas are dedicated to different functions, in which the fields of view of the sub-areas are different.

4. The optical sensor as claimed in claim 1, wherein at least one of the functions integrated on the photodetectors matrix is associated to a single microlenses subgroup which subtends a solid angle FOV, and contiguous photodetectors or photodetector clusters, associated to the microlenses subgroup, which do not always have mutually adjacent IFOVs.

5. The optical sensor as claimed in claim 1, wherein the microlenses of at least one subgroup have different and mutually contiguous fields of view, in such a way as to obtain a different resolution inside the global field of view of said subgroup.

6. The optical sensor as claimed in claim 1, wherein the microlenses of at least one subgroup have equal, but not contiguous fields of view, in such a way as to sample in non continuous fashion the global field of view of the microlenses subgroup.

7. The optical sensor as claimed in claim 1, wherein there are photodetectors used solely for separating the adjacent sub-areas of the sensitive area of the photodetectors matrix.

8. The optical sensor as claimed in claim 1, wherein said microlenses are constituted by a gradient index (GRIN) material.

9. The optical sensor as claimed in claim 1, wherein the microlenses of at least one sub-group have on their surface a selective interferential optical coating operating as a filter to transmit only wavelengths of interest.

10. The optical sensor as claimed in claim 1, wherein the photodetectors matrix is in CCD or CMOS technology, standard or with parallel architecture provided with pre-processing at the photodetector level.

11. The optical sensor as claimed in claim 1, wherein at least one sub-area of the matrix having mxn photodetectors is coupled to a subgroup of microlenses in such a way that adjacent portions of the objects plane are subtended in the image plane by photodetectors that are not mutually contiguous, wherein m and n are integers.

12. The optical sensor as claimed in claim 1, wherein a sub-area having mxn=t photodetectors which subtends a field of view of x horizontal degrees and y vertical degrees can be remapped on the matrix as sub-area pxq=t photodetectors so that each photodetector has a field of view of x/m horizontal degrees and y/n vertical degrees and central direction such as to cover a portion of the global field of view of x horizontal degrees and y vertical degrees, wherein m and n are integers.

13. The optical sensor as claimed in claim 1, comprising at least one subgroup of microlenses dedicated to a frontal scene monitoring function, in which in the microlenses belonging to said subgroup the angular separation between the central directions subtended by the adjacent microlenses is not constant and the individual fields of view subtended by the microlenses are not constant, in such a way as to vary the resolution in specific areas of interest of the scene.

14. The optical sensor as claimed in claim 1, comprising at least one subgroup of microlenses dedicated to a frontal scene monitoring function, in which in the microlenses belonging to said subgroup the angular separation between the central directions subtended by the adjacent microlenses is not constant and the individual fields of view subtended by the microlenses are constant, in such a way as to sample in non continuous fashion the portion of the scene for which a lower resolution is required.

15. The optical sensor as claimed in claim 1, wherein the parameters of the microlenses associated to each photodetector or subgroup of photodetectors are optimised in such a way as to obtain an optical pre-processing.

16. The optical sensor as claimed in claim 1, wherein in said photodetectors matrix are defined k groups of j photodetectors, each group able to create the image of the same portion of scene or of different portions of scene, on said groups being positioned diaphragms with different shapes so that when a group creates the image of the portion of scene that matches the shape of the diaphragm the signal is strongest.

17. The optical sensor as claimed in claim 1, wherein in said photodetectors matrix are defined k groups of photodetectors positioned horizontally, said groups being coupled with the respective microlenses able to create the image of k different portions of the scene.

18. The optical sensor as claimed in claim 1, comprising at least one photodetector serving the function of measuring environmental illumination, positioned in any point of the sensitive area of the photodetectors matrix, said at least one photodetector being associated to a central microlens surrounded by a certain number of microlenses, in such a way as to obtain information both about the intensity of environmental lighting by means of said central microlens, and on the intensity and direction of solar irradiation by means of said lateral microlenses.

19. The optical sensor as claimed in claim 18, wherein at least one of said lateral microlenses is oriented towards the dashboard of a vehicle to measure the solar irradiation directed thereon.

20. The optical sensor as claimed in claim 1, wherein the sub-area of the photodetectors matrix destined to perform a frontal monitoring function has the shape of a trapezoid.

21. The optical sensor as claimed in claim 1, wherein for a rain function said microlenses have their optical axis parallel to the road plane and such focal distance as to compensate for the curvature of the windshield.

22. The optical sensor as claimed in claim 1, wherein for an occupant monitoring function in said photodetectors matrix are dedicated one or more pixels coupled to a prismatic or wave guide system able to receive the image positioned to the rear of said photodetectors matrix.

23. The optical sensor as claimed in claim 1, wherein for a blind angle monitoring function in said photodetectors matrix are dedicated one or more subgroups of photodetectors, said subgroups of photodetectors having different fields of view in order to cover different directions with different resolutions.

* * * * *